(12) United States Patent
Prince et al.

(10) Patent No.: US 11,990,287 B2
(45) Date of Patent: May 21, 2024

(54) PHOTOVOLTAIC WINDOW COLOR-CONVERSION LAYERS

(71) Applicant: Alliance for Sustainable Energy, LLC, Golden, CO (US)

(72) Inventors: Kevin Joseph Prince, Golden, CO (US); Lance Michael Wheeler, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/894,992

(22) Filed: Aug. 24, 2022

(65) Prior Publication Data
US 2023/0061924 A1 Mar. 2, 2023

Related U.S. Application Data

(60) Provisional application No. 63/236,347, filed on Aug. 24, 2021.

(51) Int. Cl.
*H01L 31/00* (2006.01)
*C09B 11/24* (2006.01)
(Continued)

(52) U.S. Cl.
CPC ............. *H01G 9/209* (2013.01); *C09B 11/24* (2013.01); *C09B 67/0063* (2013.01);
(Continued)

(58) Field of Classification Search
CPC ...... H01G 9/209; H01G 9/2009; H02S 20/26; H10K 30/87; H10K 30/40; H10K 30/30;
(Continued)

(56) References Cited

U.S. PATENT DOCUMENTS 10,253,559 B2  4/2019  Wheeler
10,844,658 B2  11/2020  Wheeler et al.
(Continued)

FOREIGN PATENT DOCUMENTS

JP          2015-95438      *  5/2015
WO    WO 2017/075472     *  5/2017

OTHER PUBLICATIONS

Wei et al., "Angular and Wavelength Simultaneous Selection in Transparent OPVs Based on Near-Infrared Bragg Reflector and Antireflection Coating", IEEE Photonics Journal, vol. 9, No. 1, Feb. 2017, pp. 1-9. (Year: 2017).*

(Continued)

*Primary Examiner* — Thanh Truc Trinh
(74) *Attorney, Agent, or Firm* — Michael A. McIntyre; Alexandra M. Hall

(57) ABSTRACT

The present disclosure relates to a photovoltaic (PV) device that includes a color-conversion layer that includes at least one of a color-tuning layer and/or an intermediate layer and a photovoltaic layer where the color-conversion layer changes the appearance of the PV device when compared to a similar PV device constructed without the color-conversion layer, the color-conversion layer increases a power output of the PV device by at least one of reflecting light to the PV layer or emitting light which is redirected to the PV layer, and the device is at least partially transparent to light in the visible spectrum.

14 Claims, 27 Drawing Sheets

(51) Int. Cl.
| | |
|---|---|
| *C09B 67/20* | (2006.01) |
| *C09K 11/02* | (2006.01) |
| *C09K 11/06* | (2006.01) |
| *H01G 9/20* | (2006.01) |
| *H02S 20/26* | (2014.01) |
| *H10K 30/30* | (2023.01) |
| *H10K 30/40* | (2023.01) |
| *H10K 30/87* | (2023.01) |

(52) U.S. Cl.
CPC .............. *C09K 11/02* (2013.01); *C09K 11/06* (2013.01); *H01G 9/2009* (2013.01); *H02S 20/26* (2014.12); *H10K 30/30* (2023.02); *H10K 30/40* (2023.02); *H10K 30/87* (2023.02); *C09K 2211/1007* (2013.01); *C09K 2211/1018* (2013.01)

(58) Field of Classification Search
CPC ..... C09B 11/24; C09B 67/0063; C09K 11/02; C09K 11/06; C09K 2211/1007; C09K 2211/1018
See application file for complete search history.

(56) References Cited

U.S. PATENT DOCUMENTS

| | | | |
|---|---|---|---|
| 11,177,396 B2 | 11/2021 | Wheeler | |
| 2009/0095341 A1* | 4/2009 | Pfenninger | H01L 31/055 136/246 |
| 2015/0295112 A1* | 10/2015 | Okura | H01L 31/055 264/1.6 |
| 2017/0089128 A1 | 3/2017 | Wheeler | |
| 2018/0248063 A1* | 8/2018 | Fusco | C09K 11/06 |
| 2018/0252028 A1 | 9/2018 | Wheeler et al. | |
| 2019/0198684 A1 | 6/2019 | Wheeler | |
| 2020/0295286 A1* | 9/2020 | Forrest | H10K 30/81 |
| 2021/0043854 A1 | 2/2021 | Wheeler et al. | |
| 2022/0302400 A1 | 9/2022 | Wheeler | |

OTHER PUBLICATIONS

Sun et al., "Heat-Insulating Multifunctional Semitransparent Polymer Solar Cells", Joule 2, 1816-1826, Sep. 19, 2018. (Year: 2018).*
Wheeler et al., "Switchable photovoltaic windows enabled by reversible photothermal complex dissociation from methylammonium lead iodide", Nature Communications, 8:1722, 2017, pp. 1-9. (Year: 2017).*
Machine translation of JP 2015-95438, pp. 1-23. (Year: 2015).*
Chen, C-C et al., "Visibly Transparent Polymer Solar Cells Produced by Solution Processing," ACS Nano, vol. 6, No. 8, 2012, 6 pages.
Gaspera, E.D. et al., "Ultra-thin high efficiency semitransparent perovskite solar cells," Elsevier Nano Energy, vol. 13, 2015, 9 pages.
Güneralp, B. et al., "Global scenarios of urban density and its impacts on building energy use through 2050," PNAS, vol. 114, No. 34, Aug. 22, 2017, 6 pages.
Lee, K-T. et al., "Highly Efficient Colored Perovskite Solar Cells Integrated with Ultrathin Subwavelength Plasmonic Nanoresonators," Scientific Reports, vol. 7, 2017, 10 pages.
Rosales, B.A. et al., "Reversible multicolor chromism in layered formamidinium metal halide perovskites," Nature Communications, vol. 11, 2020, 12 pages.
Traverse, C.J. et al., "Emergence of highly transparent photovoltaics for distributed applications," Nature Energy, Review Article, vol. 2, Nov. 2017, 12 pages.
Wang, H. et al., "Bifacial, Color-Tunable Semitransparent Perovskite Solar Cells for Building-Integrated Photovoltaics," ACS Applied Materials and Interfaces, vol. 12, 2020, 10 pages.
Wheeler, L. et al., "Switchable photovoltaic windows enabled by reversible photothermal complex dissociation from methylammonium lead iodide," Nature Communications, 2017, vol. 8, 9 pages.
Wheeler, L.M. and Wheeler, V.M., "Detailed Balance Analysis of Photovoltaic Windows," ACS Energy Letters, vol. 4, 2019, 7 pages.

* cited by examiner

UV illumination (QY = 65 - 100%)

US 11,990,287 B2

PHOTOVOLTAIC WINDOW COLOR-CONVERSION LAYERS

CROSS-REFERENCE TO RELATED APPLICATIONS

This application claims priority from U.S. Provisional Patent Application No. 63/236,347 filed on Aug. 24, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Aesthetics are critical for the market acceptance and deployment of building-integrated photovoltaics. Photovoltaic (PV) windows composed of thinned inorganic layers or hybrid organic/inorganic layers can appear orange or red instead of the desired colors like neutral gray, green, or blue. Color-tuning solutions result in decreased visible light transmittance without improving and/or maintaining PV performance metrics like power conversion. Thus, there remains a need for compositions, devices, systems, and methods that can easily, reliably, and affordably change the color of photovoltaic windows.

SUMMARY

An aspect of the present disclosure is a photovoltaic (PV) device that includes a color-conversion layer that includes at least one of a color-tuning layer and/or an intermediate layer and a photovoltaic layer where the color-conversion layer changes the appearance of the PV device when compared to a similar PV device constructed without the color-conversion layer, the color-conversion layer increases a power output of the PV device by at least one of reflecting light to the PV layer or emitting light which is redirected to the PV layer, and the device is at least partially transparent to light in the visible spectrum. In some embodiments of the present disclosure, the intermediate layer may include at least one of a reflecting layer and/or a redirecting layer. In some embodiments of the present disclosure, the reflecting layer may be at least one of a Bragg reflector and/or a thin, transparent metal foil. In some embodiments of the present disclosure, the Bragg reflector may include a pair of layers, where a first layer of the pair has a first refractive index, and a second layer of the pair has a second refractive index that is higher than the first refractive index. In some embodiments of the present disclosure, the first layer may include a least one of molybdenum oxide and/or magnesium fluoride, and the second layer comprises lithium fluoride. In some embodiments of the present disclosure, the Bragg reflector may include between 1 and 10 pairs of layers. In some embodiments of the present disclosure, the first layer may have a thickness between 50 nm and 100 nm and the second layer may have a thickness between 100 nm and 200 nm. In some embodiments of the present disclosure, the color-tuning layer may be configured to absorb light having a first wavelength and re-emit light at a second wavelength that is less than the first wavelength. In some embodiments of the present disclosure, both the first wavelength and the second wavelength may be between about 400 nm and 700 nm.

In some embodiments of the present disclosure, the color-tuning layer may include a dye positioned within a matrix constructed of at least one of a solid, a liquid, and/or a gas. In some embodiments of the present disclosure, the dye may include xanthene dye. In some embodiments of the present disclosure, the xanthene dye may include at least one of oxazine-170, rhodamine B, rhodamine 6G, rhodamine 19, rhodamine 101, rhodamine 123), tris(8-hydroxyquinolinato) aluminium, and/or sulforhodamine 101. In some embodiments of the present disclosure, the matrix may be a solid. In some embodiments of the present disclosure, the solid matrix may include at least one of a polymer, a glass, a metal oxide, lithium fluoride, magnesium fluoride, and/or zinc sulfide. In some embodiments of the present disclosure, the polymer may include at least one of poly-acrylic acid, poly(methyl methacrylate, poly(vinyl acetate), polyvinylcarbozal, and/or polystyrene. In some embodiments of the present disclosure, the metal oxide may include at least one of silica and/or alumina. In some embodiments of the present disclosure, the matrix may be constructed with a plurality of nanoparticles. In some embodiments of the present disclosure, the color-tuning layer may have a thickness between 10 nm and 300 nm.

In some embodiments of the present disclosure, the PV layer may be part of a PV stack, and the PV stack may further include a hole transfer layer (HTL), an electron transfer layer (ETL), a first charge collecting layer, and a second charge collecting layer, wherein the PV layer is positioned between the HTL and the ETL, the HTL is positioned between the first charge transport layer and the PV layer, and the ETL is positioned between the second charge transport layer and the PV layer. In some embodiments of the present disclosure, the color-conversion layer may include the intermediate layer and the color-tuning layer, where the intermediate layer includes at least one layer of the PV stack or a separate layer, and the intermediate layer is positioned between the PV layer and the color-tuning layer.

An aspect of the present disclosure is a method for changing the appearance of a window having a photovoltaic (PV) layer and a color-conversion layer, where the method includes positioning the window to receive light having a first range of wavelengths, absorbing a first portion of the first range of wavelengths in the PV layer, transmitting a second portion of the first range of wavelengths to the color-conversion layer, and returning a third portion of the first range of wavelengths to the PV layer by reflecting the third portion from the color-conversion layer or returning light comprising a second range of wavelengths to the PV. Further, the second range is generated by the color-conversion layer absorbing a fourth portion of the first range of wavelengths, resulting in the color-conversion emitting the second range, and the PV layer absorbs at least one of the third portion or the second range of wavelengths.

REFERENCE NUMERALS

Figure 1:
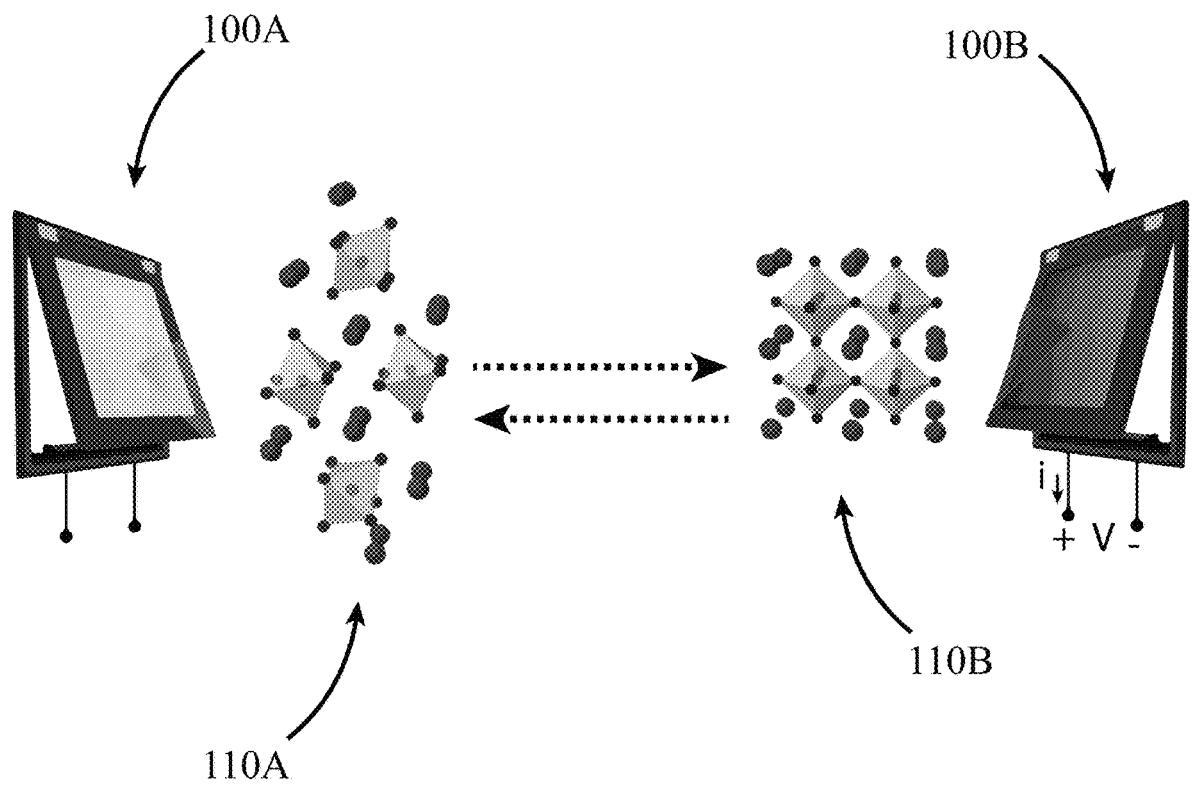
FIG. 1 illustrates an exemplary device, a switchable thermochromic window, that utilizes a color-conversion layer, according to some embodiments of the present disclosure.

A . . . incoming light
B . . . reflected light
C . . . transmitted light ($C_1$, $C_2$, $C_3$, and $C_4$)
D . . . absorbed light
E . . . reflected light
F . . . absorbed light
G . . . emitted light
100A . . . device in translucent state
100B . . . device in opaque state
110A . . . photovoltaic material in first state
110B . . . photovoltaic material in second state
210 . . . device
220 . . . first transparent layer
230 . . . photovoltaic stack
240 . . . intermediate layer
242 . . . first interface
244 . . . second interface
250 . . . color-tuning layer
260 . . . second transparent layer
300 . . . photovoltaic layer
310 . . . charge transport layer
320 . . . charge collecting layer
400 . . . perovskite
410 . . . A-cation
420 . . . B-cation
430 . . . X-anion

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to devices, systems, and methods for changing the appearance of, among other things, photovoltaic windows, and switchable devices, for example a thin film photovoltaic window composed of cadmium telluride as the absorber layer or a thermochromic photovoltaic window where a perovskite absorber material has one or more appearance states. "Appearance" as used herein refers to the color of a device as viewed from one or both sides of the device. Take for example, a thermochromic window (or a photochromic window, electrochromic window, solvatochromic window, and/or mechanochromic window). A thermochromic window may include one or more elements positioned in a stacked configuration, where each element is substantially planar, and each element is substantially parallel to a reference plane. FIG. 1 illustrates an example of a switchable thermochromic window according to some embodiments of the present disclosure. In this example, the device 100 has two states, a translucent state 100A and an opaque state 110B. The device is reversibly switchable between the two states by affecting a change in at least one layer of the device, in this example, in a layer constructed of a photovoltaic material. In this particular example, the photovoltaic material is a metal halide perovskite, which may be reversibly switched between two crystalline structures, i.e., states. When in a first state 110A, the perovskite layer is substantially transparent in the visible spectrum of light. When in a second state 110B, the perovskite layer is substantially opaque in the visible spectrum of light.

Referring again to FIG. 1, when the perovskite is in an ordered state (i.e., a substantially opaque state) corresponding to the second state 110B, the perovskite is photovoltaic and will generate an open circuit voltage (V) when exposed to light by absorbing a portion of the incoming light, where the wavelength absorbed is determined by the specific perovskite composition. Conversely, when the perovskite is in a disordered state (i.e., a substantially transparent state) corresponding to the first state 110A, the perovskite layer is no longer photoactive and will not generate a light-induced voltage. In either the first state 110A (transparent) or the second state 110B (opaque), the color of the device as observed by an observer on either side of the device (e.g., for a window, either inside or outside the compartment incorporating the window) is determined by, among other things, the specific perovskite composition. For example, a perovskite in a light-absorbing state (110B), may have colors ranging from gray to black, and in some cases may have colors spanning the spectrum of light from red to orange to yellow colors. However, the colors provided by the perovskite layers may not be aesthetically pleasing to the inhabitants of the building utilizing the window(s) constructed with the perovskite layer. So, it may be desirable to modify the appearance and/or aesthetics of such a device by changing the color to one that is more agreeable, as perceived by a person positioned on one or both sides of the device. The present disclosure, provides compositions, devices, and methods for accomplishing such color changes.

Note that the thermochromic window illustrated in FIG. 1 is provided for illustrative purposes only and is not intended to be limiting. For example, devices utilizing the concepts described herein need not utilize a layer that is switchable between two states, two colors, and/or two different levels of transmittance and/or reflectance. Nor does a layer included in such a device need to be photovoltaic. In general, any device, system, and/or structure having a section and/or portion that receives light from a light source and transmits at least a portion of the light from a front surface of the section and/or portion through the device to a back surface of the section and/or portion may utilize the concepts described herein. However, in short, the present disclosure focuses primarily on devices configured to receive light from a light source, e.g., the sun, and then manipulate and change the spectrum of light that is transmitted through the device and/or reflected from the device to a desired spectrum to provide a more desirable appearance.

Figure 2:
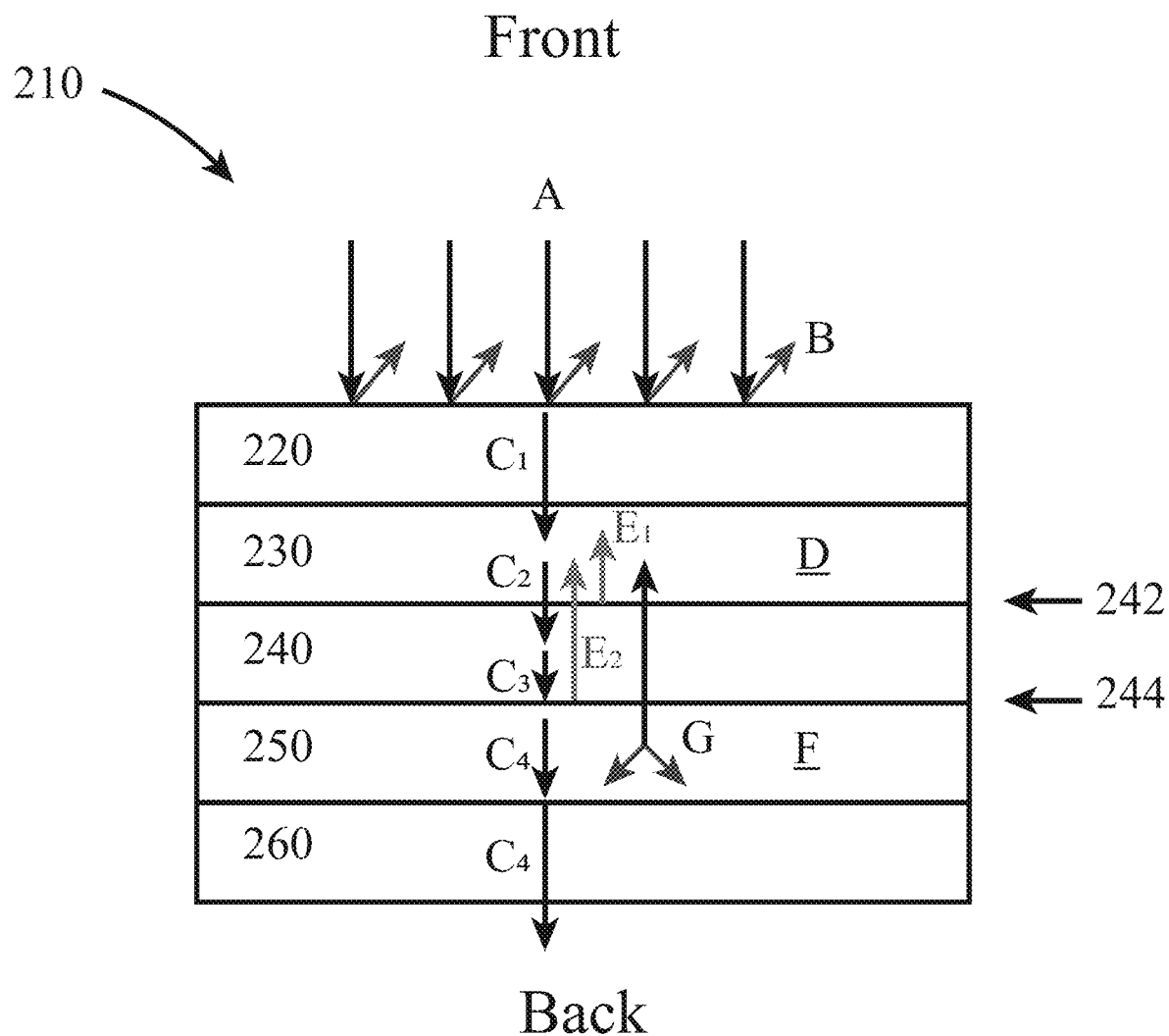
FIG. 2 illustrates an exemplary device utilizing a color-conversion layer that includes both a color-tuning layer and an intermediate layer, according to some embodiments of the present disclosure. In this embodiment the intermediate serves two functions: it reflects some of the original incoming light, referred to herein as a reflecting layer, and it redirects some of the light emitted by the color-tuning layer, referred to herein as a redirecting layer.

FIG. 2 illustrates a device 210, e.g., switchable window, which includes elements for changing the appearance of the device 210 relative to the appearance of the same device without the inclusion of those elements. For example, among other things, a device 210 may include an intermediate layer 240 having one or more surfaces (e.g., 242 and/or 244) that are configured to reflect, $E_1$ and $E_2$, at least some of the light originally entering the device 210. In some embodiments of the present disclosure, a device may include a color-tuning layer 250 that is configured to absorb F, some of the incoming light A. In some embodiments of the present disclosure, a color-tuning layer 250 may emit (i.e., re-emit) light G, as a result of the absorption of some of the incoming light. In some embodiments of the present disclosure, a color-tuning layer 250 may be positioned adjacent to an intermediate layer 240, which is configured to redirect at least some of the light emitted G by the color-tuning layer 250. This may be advantageous because the light emitted G in a color-tuning layer 250 may be emitted in all directions in three-dimensional space. By designing an intermediate layer 240, for example to have a higher refractive index than the adjacent color-tuning layer 250, the light emitted G may be preferentially directed towards the intermediate layer 240 and the PV stack 230, thereby providing additional light to be absorbed D, by the PV stack 230. This in turn, may allow the PV stack 230 to provide a higher power output.

Regardless of the specific design, the elements described herein can affect a change in the appearance, e.g., color, of the device 210 as viewed by an observer positioned in "front" of the device 210 and/or positioned at the "back" of the device 210. For the example where a color-tuning layer 250 is positioned within a device 210 and configured to emit light, the emitted light G, may add a spectrum of light that may not have been present in the incoming light A, e.g., the solar spectrum, thereby changing the appearance of the device, e.g., color, as viewed by an observer positioned in "front" of the device 210 and/or positioned at the "back" of the device 210.

Referring again to FIG. 2, as described above, a color-tuning layer 250 may be paired with an intermediate layer 240 configured to redirect light emitted G by the color-tuning layer 250. In some embodiments of the present disclosure, a device 210 may include an intermediate layer 240 that is configured to reflect, e.g., $E_1$ and/or $E_2$, at least a portion of the incoming light, A. Reflecting may occur anywhere within an intermediate layer 240 or at the interfaces an intermediate layer 240 shares with neighboring layers (e.g., 242 and 244). In some embodiments of the present disclosure, a device 210 may include an intermediate layer 240 designed to reflect incoming light A and may not have a color-tuning layer 250. In some embodiments of the present disclosure, a device 210 may include an intermediate layer 240 designed to both reflect incoming light A and redirect light emitted G by a color-tuning layer 250 positioned adjacent to the intermediate layer 240.

The device 210 shown in FIG. 2 is shown for illustrative purposes and is not intended to be limiting. For example, a device 210 may include a color-tuning layer 250, without having an intermediate layer 240. In some embodiments of the present disclosure, a device 210 may include an intermediate layer 240, without having a color-tuning layer 250. Further, an intermediate layer 240 may use only reflectance to affect the final color of the device 210 or an intermediate layer 240 may only redirect light emitted from a color-tuning layer 250 to affect the final color of the device 210. When an intermediate layer 240 only utilizes, or mostly utilizes reflectance as a mechanism to change the color of a device 210, the intermediate layer 240 is referred to herein as a "reflective layer". When an intermediate layer 240 only utilizes, or mostly utilizes a redirection of light emitted in a color-tuning layer as the mechanism to change the color of a device 210, the intermediate layer 240 is referred to herein as a "redirecting layer". In some embodiments of the present disclosure, a device 210 may have one or more reflective layers. In some embodiments of the present disclosure, a device 210 may have one or more redirecting layers. There are many possible combinations and orders of the layers for a device 210 incorporating at least one color-tuning layer 250 and/or intermediate layer 240 and the specific design of a device stack will depend on the application and materials of construction selected. Regardless, the elements described above will change the appearance of a device, e.g., color, from an original less desirable color to a final more desirable color, as viewed by an observer positioned in "front" of the device 210 and/or positioned at the "back" of the device 210.

FIG. 2 illustrates some interactions that the exemplary device 210 may have with light. In this example, the "front" surface of the device 210 is positioned to receive incoming light A. In some embodiments of the present disclosure, the device 210 may be a window and the light source creating the incoming light A may be the sun. However, the concepts described herein may apply to any other at least partially transparent device and the light source may be any other natural and/or artificial light source. As shown in FIG. 2, a device 210 may include several planar elements positioned substantially parallel to one another between a first transparent layer 220 and a second transparent layer 260. In some embodiments of the present disclosure, a first transparent layer 220 and/or second transparent layer 260 may be constructed using at least one of a glass, a transparent oxide, and/or a plastic.

A first transparent layer 220 may transmit all light that is visible to the human eye, in a range approximately between 380 nm and 800 nm but may also be semitransparent where it partially absorbs certain wavelengths in the visible spectrum. A first transparent layer 220 may have a thickness between 0.1 mm and 10 cm, or between 1 mm and 10 mm, to provide structural support. The incoming light A impinges upon an outer surface of the first transparent layer 220 and a portion of the incoming light A may be reflected from the surface, as indicated by B. At least a portion of the remaining incoming light may be transmitted through the first transparent layer 220, as indicated by $C_1$. In some embodiments of the present disclosure, the light transmitted through the first transparent layer 220, $C_1$, may then enter an underlying PV stack 230 (see FIG. 3 for details regarding an exemplary PV stack 230). A PV stack 230, as described above, may include a light-absorbing, photovoltaic layer constructed of a metal halide perovskite (not shown). The light absorbed by a PV stack is indicated in FIG. 2 as D. The remainder of the light originally transmitted through the first transparent layer 220, $C_1$, may be transmitted through the PV stack 230, as indicated by $C_2$. (Note: the reference letter C refers generally to transmitted light.)

The light transmitted through the first transparent layer 220 and the PV stack 230, $C_2$, may then impinge upon and/or enter an intermediate layer 240. An intermediate layer 240 may be configured, as previously described, to perform one or more actions that change the appearance, e.g., color, of the device 210 that incorporates it. For example, in some embodiments of the present disclosure, an intermediate layer 240 may be configured to reflect at least some of the light it receives. This may occur at a first interface 242 formed by the placement of the intermediate layer 240 adjacent to a PV stack 230 and/or at a second interface 244 formed by its placement adjacent to an underlying color-tuning layer 250. Reflection of the light at the first interface 242 is indicated by $E_1$, and the light reflected from the second interface is indicated by $E_2$. In either case, the light reflected (generically referred to as E), is back towards the "front" of the device 210.

As previously described, in some embodiments of the present disclosure, an intermediate layer 240 may be selected having an index of refraction that enables a significant portion of any light emitted in adjacent layers positioned more towards the "back" of the device to be directed primarily towards the "front" of the device. For example, an intermediate layer 240 may be configured to act as a "redirecting layer" and receive at least a portion of light emitted G from an adjacent color-tuning layer 250 and "redirect" it to the PV layer. This may be achieved by the appropriate selection of refractive indices. In some embodiments of the present disclosure, an intermediate layer 240 may be configured to perform as both a "reflecting layer" and a "redirecting layer". Such a hybrid layer may both reflect a first portion of light, $E_1$ and/or $E_2$, at a first interface 242 and/or a second interface, 244, while simultaneously receiving and redirecting a second portion of the light G originally emitted by a neighboring color-tuning layer 250. An intermediate layer 240 may be constructed using at least one of a polymer, a glass, liquid, and/or gas and may also serve to bond or fill space between the color-tuning layer 250 and the PV stack 230. An example of a polymer that may be used to construct an intermediate layer 240 is ethylene-vinyl acetate (EVA). To operate as part of a window, an intermediate layer 240 should be transparent to the light being transmitted from the PV stack 230 and reflected and/or emitted from an adjacent color-tuning layer 250. In some embodiments of the present disclosure, an intermediate layer 240 may be designed to have a refractive index to preferentially direct light being reflected or emitted from 250 color-tuning layer into the 230 PV stack. In some embodiments of the present disclosure, an intermediate layer 240 may be omitted from the device 210 design stack and the color-tuning layer 250 may be positioned to be in direct contact with the PV stack 230.

Referring again to FIG. 2, the light transmitted through the first transparent layer 220, the PV stack 230, and the intermediate layer 240, may then enter a color-tuning layer 250, as indicated by $C_3$. In some embodiments of the present disclosure, a color-tuning layer 250 may be configured to absorb at least a portion of the light, $C_3$, entering the color-tuning layer 250. This absorbed portion of light is indicated in FIG. 2 as F. In some embodiments of the present disclosure, as a result of absorbing light, F, a color-tuning layer 250 may emit light, as indicated by G. As shown in FIG. 2, this emitted light G may radiate in all directions in space. However, as described above, its neighboring intermediate layer 240 may be configured so that at least a portion of the emitted light, G, is redirected preferentially towards the "front" of the device 210 and towards a PV layer 230. This may be achieved, for example, by selecting a material of construction for the intermediate layer 240 that has a higher index of refraction than the color-tuning layer 250.

A color-tuning layer 250 may be fabricated from any material that can absorb F and re-emit light G and/or preferentially reflect certain wavelengths (not shown). For materials that absorb and re-emit light, it is ideal to use materials with a high photoluminescence quantum yield and the correct absorption and re-emission wavelengths for color-tuning and PV stack 230 re-absorption. Examples of materials suitable to absorb and re-emit light include xanthene dyes such as oxazine-170 (Ox170), rhodamine B (RdB), rhodamine 6G (Rd6G), rhodamine 19 (Rd19), rhodamine 101 (Rd101), rhodamine 123 (Rd123), Tris(8-hydroxyquinolinato)aluminium, and/or sulforhodamine 101 (SRd101). In some embodiments of the present disclosure, such absorbing/re-emitting materials may be positioned within a support matrix. An example matrix is a polymer such as poly-acrylic acid (PAA), poly(methyl methacrylate (PMMA), poly(vinyl acetate) (PVAc), polyvinylcarbozal (PVK), polystyrene, and/or other small molecules. However, a matrix to hold dye molecules, to construct an absorbing/emitting color-tuning layer 250, may also be constructed using an inorganic matrix such as glass, silica ($SiO_2$), alumina ($Al_2O_3$), lithium fluoride, magnesium fluoride, and zinc sulfide (ZnS). The matrix may be porous and/or composed of nanoparticles that may be organic (e.g., polymers such as PMMA, PAA, PVAc, etc.) and/or inorganic materials (e.g., silica, alumina, magnesium fluoride, silver, gold, etc.). A support matrix may be constructed using a solid, a liquid, and/or a gas.

As discussed above, another mechanism besides light absorption, light re-emission, and light re-directing is the reflection of light. Suitable "redirecting layers", i.e., intermediate layers 240 that reflect light, will preferentially reflect certain wavelengths and, in some embodiments of the present disclosure, may be constructed using one-dimensional photonic crystals. Examples of one-dimensional photonic crystals include Bragg reflectors, Bragg gratings, and Bragg mirrors, which are generally referred to herein as "Bragg reflectors" unless indicated otherwise. Bragg reflectors are optical nanostructures comprised of regularly repeating thin films of high and low refractive index. Certain wavelengths of light will either transmit or be reflected depending on the wavelength and thickness of each layer through destructive interference. Examples of low and high refractive index materials include molybdenum oxide ($MoO_3$) and magnesium fluoride ($MgF_2$) or lithium fluoride (LiF), respectively.

Finally, referring again to FIG. 2, the light transmitted through the exemplary device 210, through a first transparent layer 220, a PV stack 230, an intermediate layer 240, and a color-tuning layer 250, $C_4$, may then enter a second transparent layer 260. In some embodiments of the present disclosure, a second transparent layer 260 may be constructed of a glass, a transparent oxide, and/or a plastic. The second transparent layer 260 is typically configured to be able to transmit all light visible to the human eye, in the vicinity of 380 nm to 800 nm, but can also be semitransparent where it partially absorbs certain wavelengths in this region (not shown). A second transparent layer 260 may have a thickness between 0.1 mm and 10 cm, or between 1 mm and 10 mm, to provide structural support. In general, a device 210 and the layers used to construct it, like those described above, may be sized to fit any existing window technology such as insulating glass units.

It should be noted that the device 210 illustrated in FIG. 2 is provided for illustrative reasons and provides an embodiment which describes at many of the concepts of the present disclosure. However, it is not intended to be limiting. For example, the relative positions of the various planar elements may be changed and/or some removed. Further, every layer illustrated in FIG. 2 may interact differently from what was previously described. For example, each layer may interact with light by at least one of absorbing, transmitting, reflecting, and/or emitting light. The interactions occurring will depend on the materials of construction selected for each layer, their physical properties, and the thicknesses of the various layers.

Figure 3:
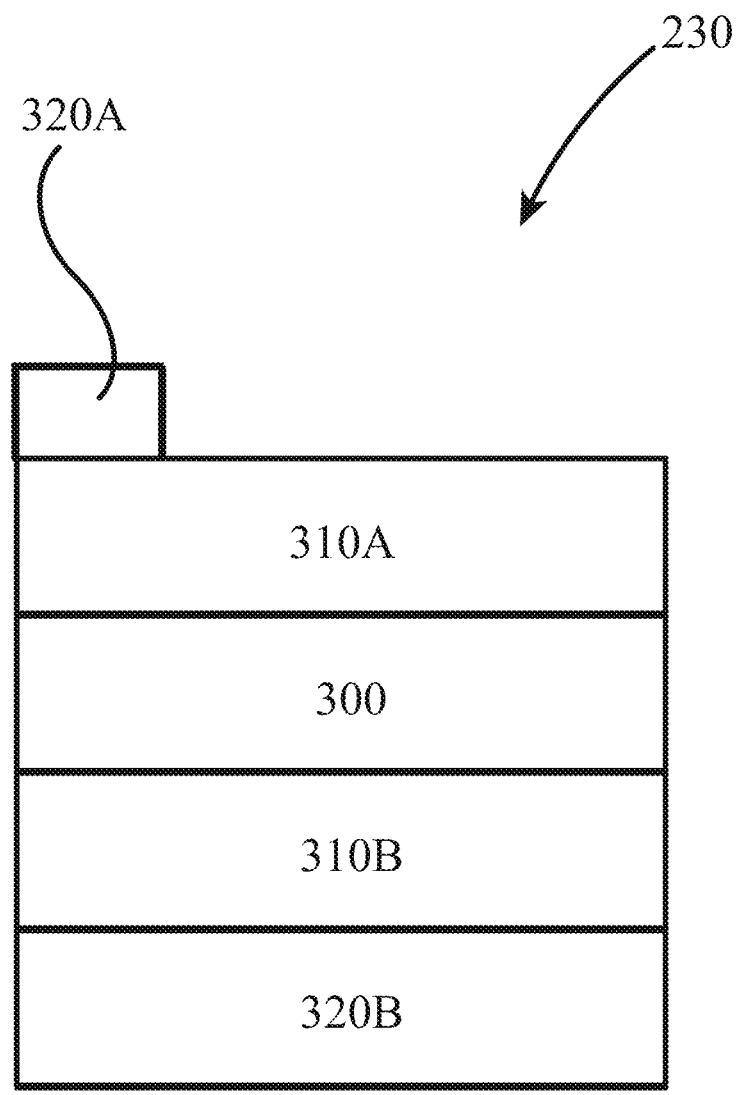
FIG. 3 illustrates a photovoltaic stack, according to some embodiments of the present disclosure.

FIG. 3 illustrates an example of PV stack 230 that may be used in a device 210 as shown in FIGS. 1 and 2, according to some embodiments of the present disclosure. A PV stack 230 may include an active layer, i.e., photovoltaic layer, 300 (e.g., a perovskite-containing layer) positioned between a first charge transport layer 310A and a second charge transport layer 310B. A PV stack 230 may also include a first charge collecting layer 320A electrically connected to the first charge transport layer 310A (a hole transport layer (HTL) or an electron transport layer (ETL)), and a second charge collecting layer 320B (the opposite of the first charge transport layer 310A) electrically connected with the second charge transport layer 310B. In some embodiments of the present disclosure, a PV layer 300 may absorb light to generate a voltage and/or a current, or a PV layer 300 may emit light when a voltage and/or current is applied to the active layer 710. The example illustrated in FIG. 3 has only one PV layer 300. However, it is to be understood that a PV stack 230 may include one or more active layers, for example, stacked on top of each other to maximize the amount of the sun's energy that is converted to electricity in a photovoltaic device.

Each layer of a PV stack 230 may be constructed from a number of materials, as long as they are at least partially transparent to light in visible spectrum. For example, a charge collecting layer 310 (310A and/or 310B) may be constructed using a conducting material such as a transparent conducting oxide (TCO). Examples of TCOs include doped tin oxides and/or doped zinc oxides, such as indium-doped tin oxide (ITO), fluorine-doped tin oxide (FTO), indium-doped zinc oxide (IZO), aluminum-doped zinc oxide (AZO), and magnesium-doped zinc oxide (MZO). Examples of metals include titanium (Ti), nickel (Ni), aluminum (Al), copper (Cu), gold (Au), and silver (Ag). In some embodiments of the present disclosure, an electron transport layer ETL may be constructed from at least one of an inorganic oxide such as zinc oxide (ZnO), titanium dioxide ($TiO_2$), tungsten oxide ($WO_3$) and/or tin oxide ($SnO_2$). An ETL may be made of at least one of an organic polymer, a fullerene, self-assembled monolayers (SAMs) and/or derivatives such $C_{60}$ or phenyl-C61-butyric acid methyl ester (PCBM).

In some embodiments of the present disclosure, a hole transport layer (HTL) may be constructed using at least one of nickel oxide, copper oxide, copper iodide, and/or copper thiocyanate. Other HTL materials that may be used in some embodiments of the present disclosure include organic conductors such as poly(3-hexylthiophene-2,5-diyl) (P3HT), octakis(4-methoxyphenyl)-9,9-spirobi[9H-fluorene]-2,2,7,7-tetramine (spiro-OMeTAD), and/or poly(3,4-ethylene-dioythiophene):poly(styrenesulfonate) (PEDOT:PSS). Nanomaterials such as carbon nanotubes, graphene, and/or quantum dots may also be used to construct an HTL. Self-assembling molecules may also be used to modify oxide interfaces to produce HTLs. Self-assembling molecules include [2-(9H-Carbazol-9-yl)ethyl]phosphonic acid (2PACz) and/or [4-(3,6-Dimethyl-9H-carbazol-9-yl)butyl]phosphonic acid (Me-4PACz). In some embodiments of the present disclosure, the PV layer 300 of a PV stack 230 of a device 210 utilizing at least one of a color-tuning layer 250 and/or an intermediate layer 240 may contain any suitable semiconducting material. Examples include metal halide perovskites, organic photovoltaic, silicon (Si), cadmium telluride (Cd(Se,Te)), chalcopyrites ((Ag,Cu)(In,Ga,Al)(Se,S)$_2$), kesterites ((Ag,Cu)$_2$(Zn,Cd)(Sn,Ge)(Se,S)$_4$), and/or III-V alloys ((Al,Ga,In,)(N,P,As)).

Figure 4:
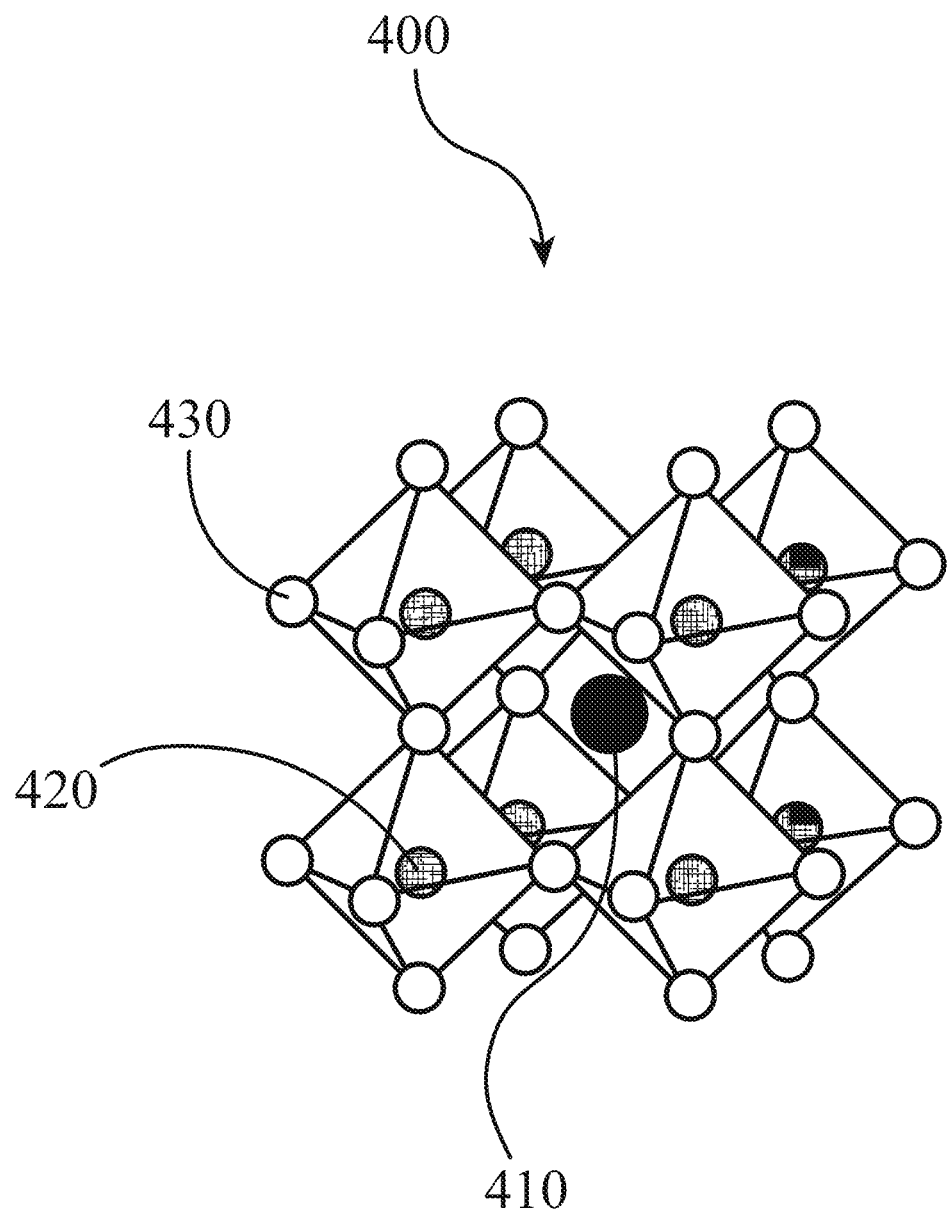
FIG. 4 illustrates a perovskite crystal having a cubic structure, according to some embodiments of the present disclosure.

In general, the term "perovskite" refers to compositions having a network of corner-sharing $BX_6$ octahedra resulting in the general stoichiometry of $ABX_3$. FIG. 4 illustrates that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 4 that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

A perovskite in the α-phase may be visualized as a cubic unit cell, where the B-cation 120 is positioned at the center of the cube, an A-cation 110 is positioned at each corner of the cube, and an X-anion 130 is face-centered on each face of the cube. The X-anions 130 and the B-cations 120 of a perovskite in the α-phase are aligned along an axis; e.g., where the angle at the X-anion 130 between two neighboring B-cations 120 is exactly 180 degrees, referred to herein as the tilt angle. However, a perovskite 100 may assume other corner-sharing crystalline phases having tilt angles not equal to 180 degrees. For example, a perovskite may also assume a tetragonal crystalline phase (i.e., β-$ABX_3$) and/or an orthorhombic crystalline phase (i.e., γ-$ABX_3$), where the adjacent octahedra are tilted relative to the reference axes a, b, and c. In addition, the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. One example of a non-perovskite structure is structure characterized by face-sharing $BX_6$ octahedra resulting in a hexagonal crystalline structure and a second example of a non-perovskite structure is characterized by edge-sharing $BX_6$ octahedra resulting in an orthorhombic crystalline structure.

Figure 5:
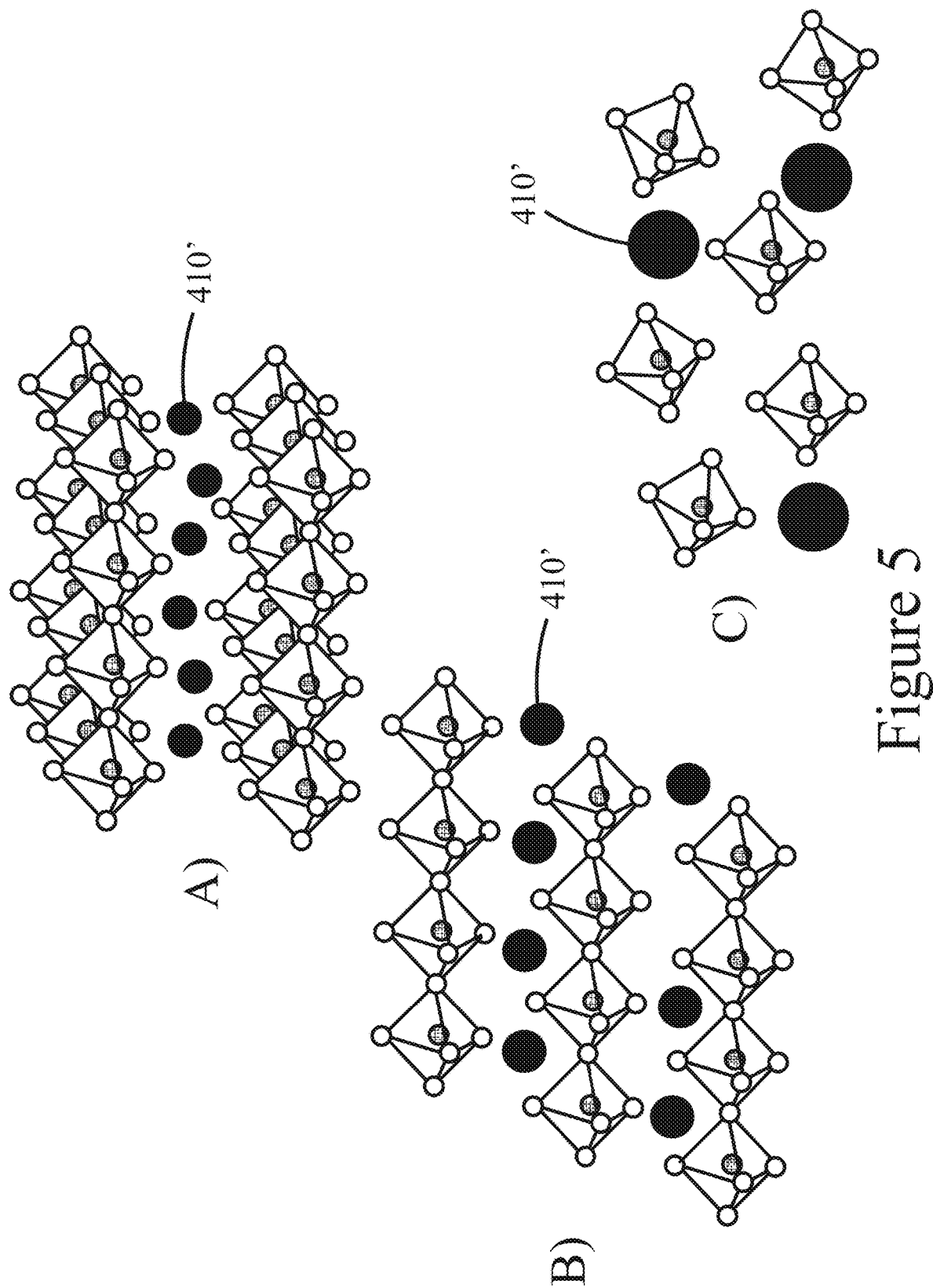
FIG. 5 illustrates 2D, 1D, and 0D perovskite-like structures, in Panels A, B, and C, respectively, according to some embodiments of the present disclosure.

Further, referring now to FIG. 5, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 5, such lower dimensional, perovskite-like structures still include the $BX_6$ octahedra, and depending on the dimensionality, e.g., 2D or 1D, may still maintain a degree of X-anion corner-sharing. However, as shown in FIG. 5, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 5, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A)_m(A)_{n-1}B_nX_{3n+1}$, where monovalent (m=2) or divalent (m=1) A' cations 110' can intercalate between the X-anions of 2D perovskite-like sheets. Referring to Panel B of FIG. 5, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 5, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

For simplification, as used herein the term "perovskite" will refer to each of the structures illustrated in FIGS. 4 and 5, unless specified otherwise. Thus, unless specified otherwise, the term "perovskite" as used herein includes each of a true corner-sharing $ABX_3$ perovskite, as well as perovskite-like compositions having 0D, 1D, and/or 2D structures like those shown in FIG. 5, as well as non-perovskites.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetyl ammonium, dimethyl ammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

Thermochromic or photochromic color-tuning layers may be composed of organic materials, inorganic materials, or organic/inorganic hybrids. Organic materials that exhibit chromism are highly conjugated. They include such as quinones, oxazines, thiazines, phthalides, tetrazolium salts, cyanines, and phenazines (leuco dyes). Organic materials may also include liquid crystals such as cholesteryl nonanoate or cholesteryl benzoate. Inorganic materials include oxides such as vanadium oxide, tungsten oxide, nickel oxide, and titanium oxide. Organic/inorganic hybrid materials include perovskites and metal coordination complexes ($M_xL_y$) is a metal center such as Ni, Fe, Cr, V, Mo, Co, or Cu, and L is a mono or polydentate ligand such as chloride, bromide, iodide, water, amines, alcohols, diols, pyridines, and bipyridines. The metal center may be suspended in a matrix or excess ligands and polymer and must consist of one or more ligands. At elevated temperature, a ligand exchange occurs, leading to a color change.

The present disclosure relates to devices that utilize absorbing/emitting/reflecting color-tuning layers paired with intermediate layers designed to capture and redirect the light emitted in the color-tuning layers. Such intermediate layers are referred to herein as "redirecting layers". In some embodiments of the present disclosure, a color-tuning layer was constructed using dye molecules embedded in a polymer matrix and/or inorganic matrix. In some embodiments of the present disclosure, a device included an intermediate layer configured to reflect light directed to and transmitted through at least a portion of the device; the intermediate layer was configured as a "reflecting layer". In some embodiments of the present disclosure, a Bragg reflector was used as a reflecting layer. As described above, a color-tuning layer may absorb at least a portion of the visible light spectrum and re-emit light at a different color, and/or at the same color, into an adjacent structure of the device; e.g., a PV layer, and/or intermediate layer. As described above, an intermediate layer, may also preferentially transmit and reflect light at difference colors (i.e., a reflecting layer). The technology described herein, therefore, gives flexibility regarding the aesthetics of a solar cell, while also increasing the solar cell's performance, e.g., power conversion efficiency (PCE).

Figure 6A:
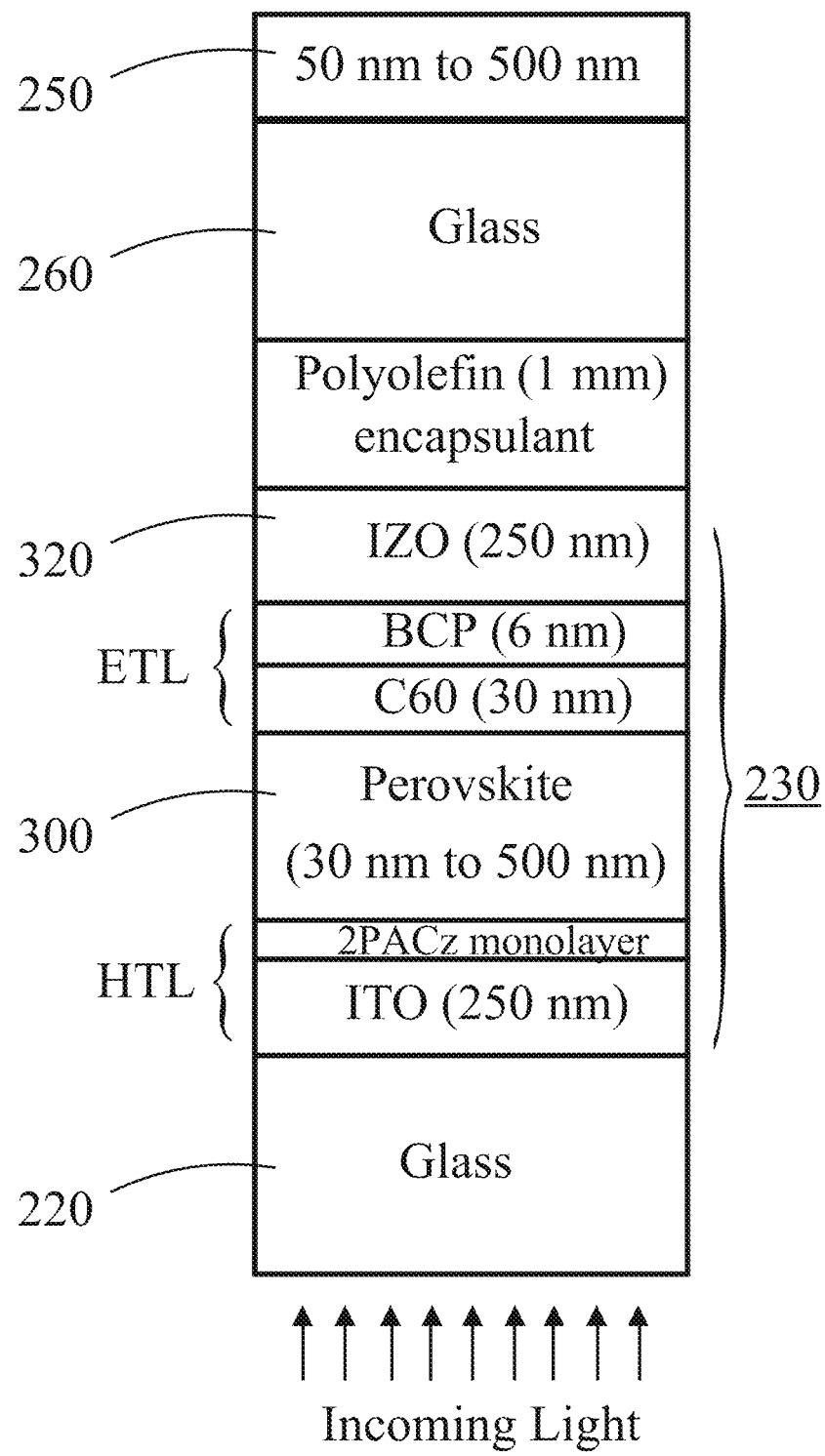
FIG. 6A illustrates a device, as tested herein, that includes a color-tuning layer and a PV stack, according to some embodiments of the present disclosure.
Figure 6B:
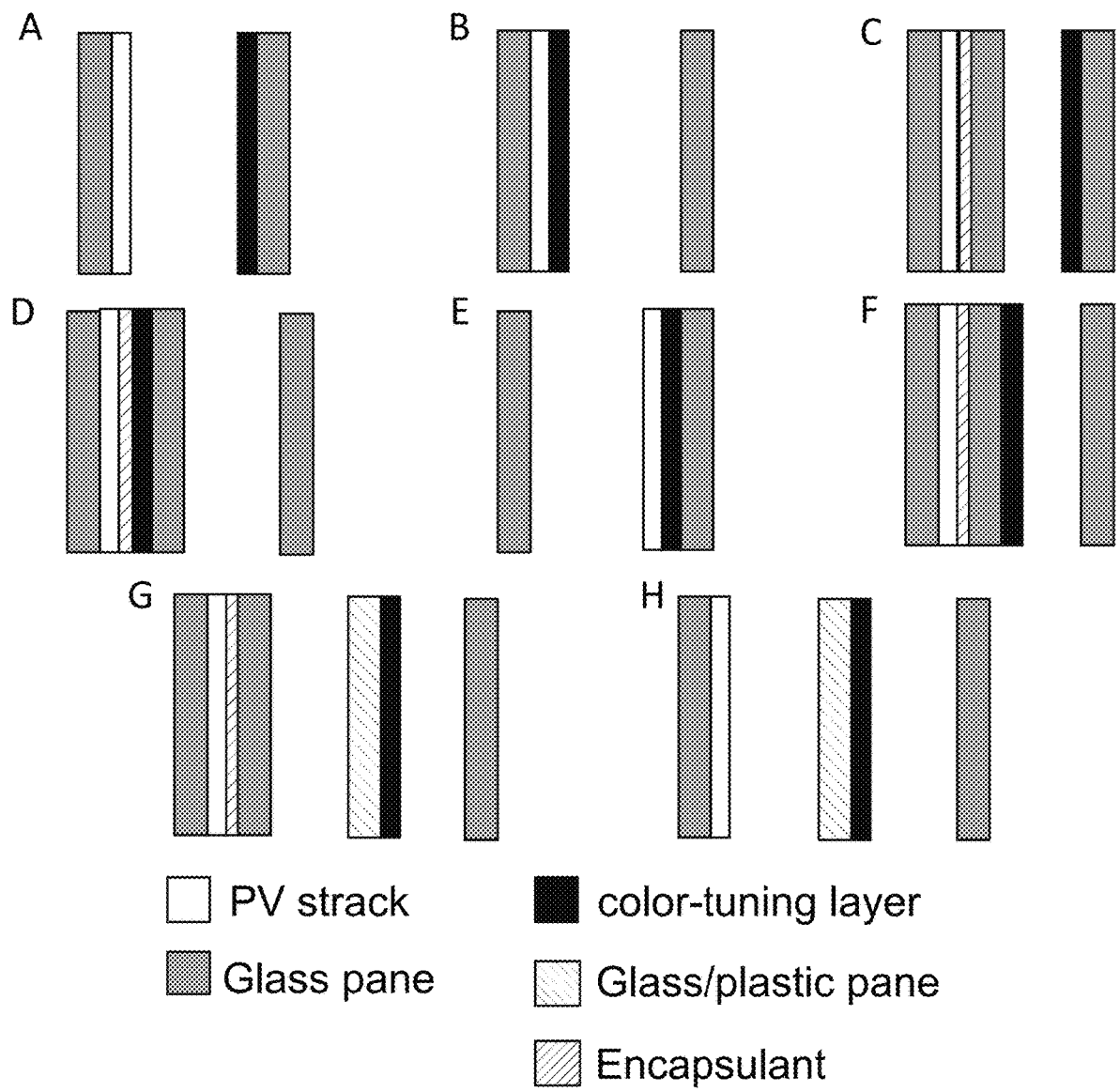
FIG. 6B illustrates a variety of device architectures (A-H) that include color-tuning layers and PV device stacks, according to some embodiments of the present disclosure. The same general architectures may be applied using reflecting layers.

Referring to FIG. 6A, some embodiments of the present disclosure relates to a thin perovskite PV device is laminated to glass with a color-tuning layer. The perovskite PV device is deposited on glass [220] with ITO sputtered on it. Depositing a self-assembled monolayer onto the ITO (2PACz) completes the HTL by adjusting the energy levels of the ITO. Perovskite [300] is deposited onto the HTL, typically with a thickness that allows for visible light transmission (<500 nm). The PV device is completed by evaporating C60 and BCP to produce an ETL, followed by IZO as a transparent back contact. Separately, a dye-impregnated polymer layer is deposited onto glass [260] to form an emissive color-tuning layer [250]. Alternatively, a series of alternating materials with high and low indices of refraction are deposited using vacuum evaporation or sputtering. The color-tuned PV laminate is completed by laminating the PV device to the separate light-tuning layer on glass using a hot press and a polyolefin encapsulation layer. The encapsulation layer may also be composed Surlyn, ethylene vinyl acetate, or polyvinylbutyral, for example. The PV device and color-tuning layer in FIG. 6A may be integrated into an insulating glass unit (IGU) in a number of ways. The IGU may be composed of 2 or three panes of glass. The interior pane in a triple-glazed IGU may also be replaced by a plastic sheet. FIG. 6B shows a number of permutations where the color balance layer may be deposited on the interior or exterior of each of the glass or plastic components. The PV device may also be laminated to glass with and without the color-tuning layer. The PV device may also remain unlaminated.

Figure 7A:
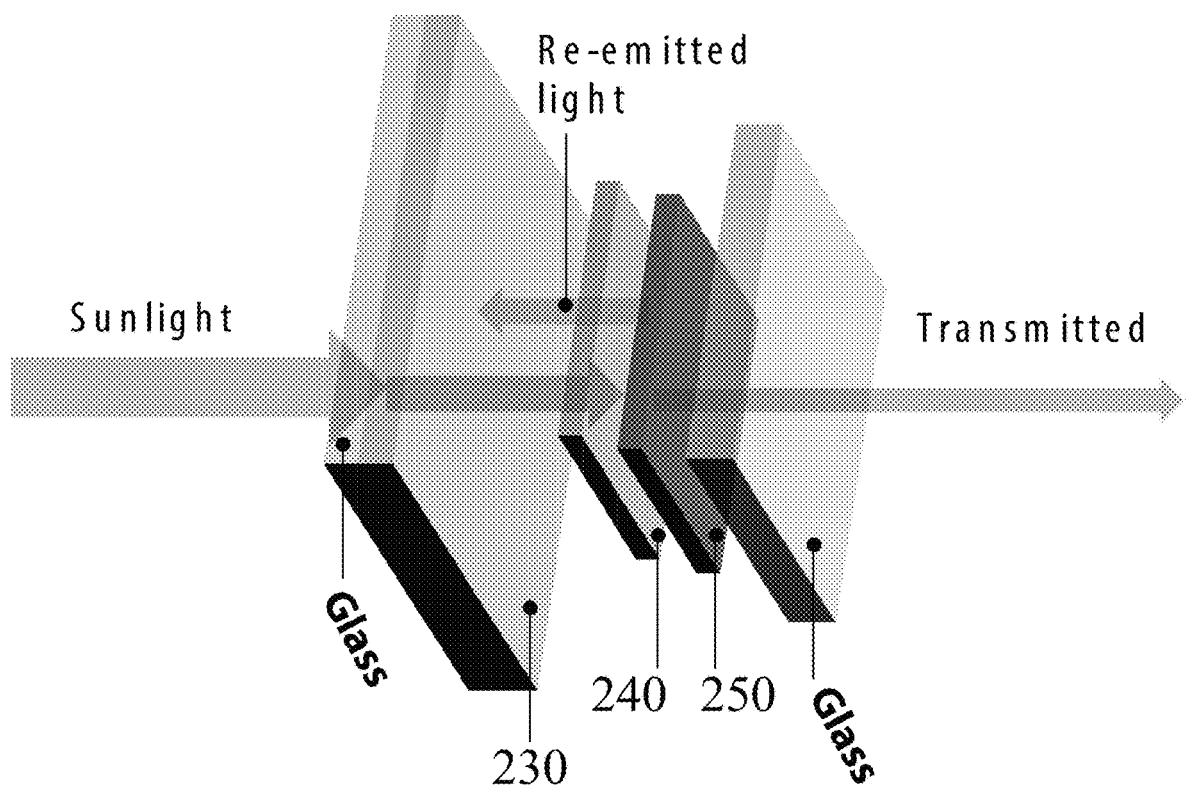
FIG. 7A illustrates a schematic of a device utilizing a color-conversion layer that includes both a color-tuning layer and a redirecting layer. This schematic highlights the light transmission, light absorption, and light emission of the exemplary color-tuning layer, whereas the redirecting layer is configured to preferentially direct light back towards the original light source, e.g., the sun, according to some embodiments of the present disclosure.

In some embodiments of the present disclosure, at least one of a color-tuning layer and/or an intermediate layer may be laminated onto a semi-transparent PV device to achieve at least one of a neutral color and/or increased photocurrent. Semi-transparent PV devices absorb some photons to generate electricity and transmit the rest which contributes to the visible light transmittance (VLT). To "balance the color", photons in the transmitted region may be absorbed in a color-tuning layer. The technology described herein, utilize color-tuning layers constructed with materials having high photoluminescence quantum yield (PLQY) and that absorb and re-emit light back into a semi-transparent PV device (see FIG. 7A), and/or reflecting intermediate layers that preferentially reflect light back into the semi-transparent PV device.

Figure 7B:
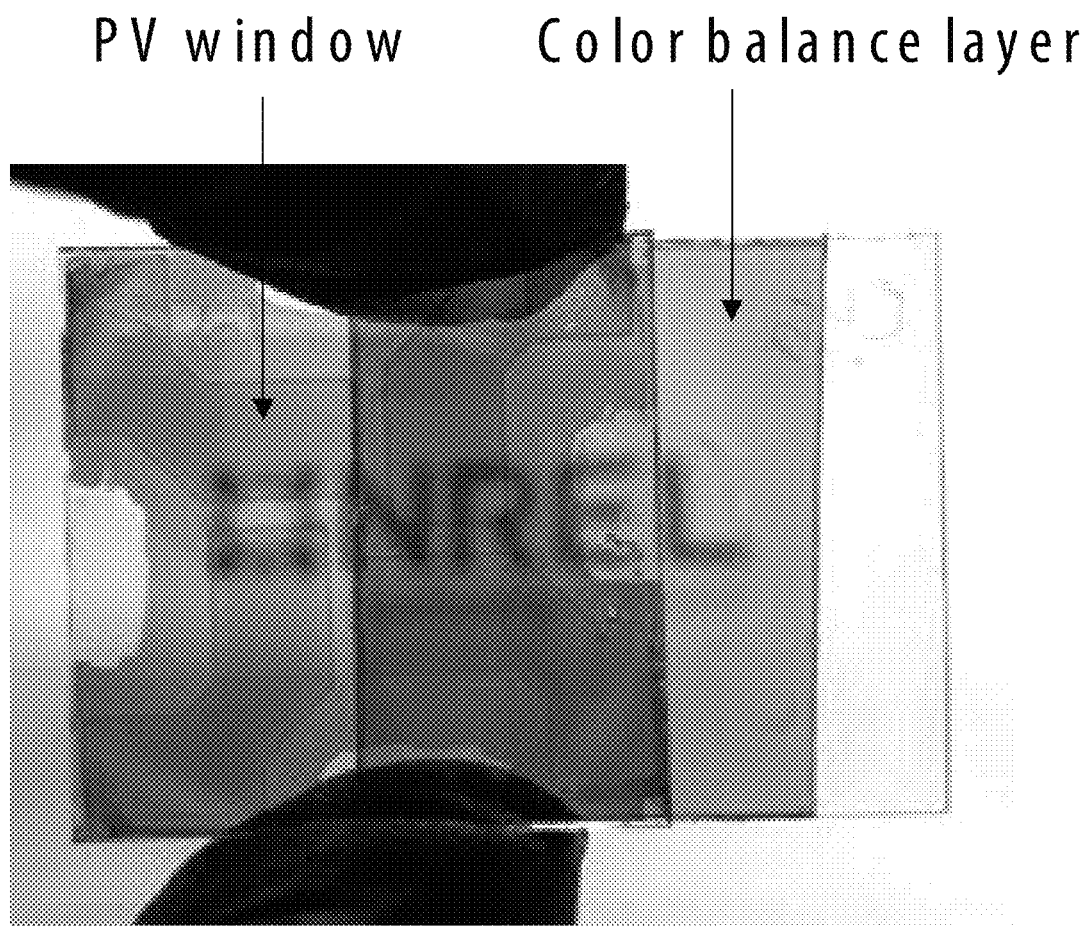
FIG. 7B illustrates a photograph of a semi-transparent perovskite PV device overlapped with an exemplary polymer/dye color-tuning layer and redirecting layer, as shown in FIG. 7A, according to some embodiments of the present disclosure.
Figure 7C:
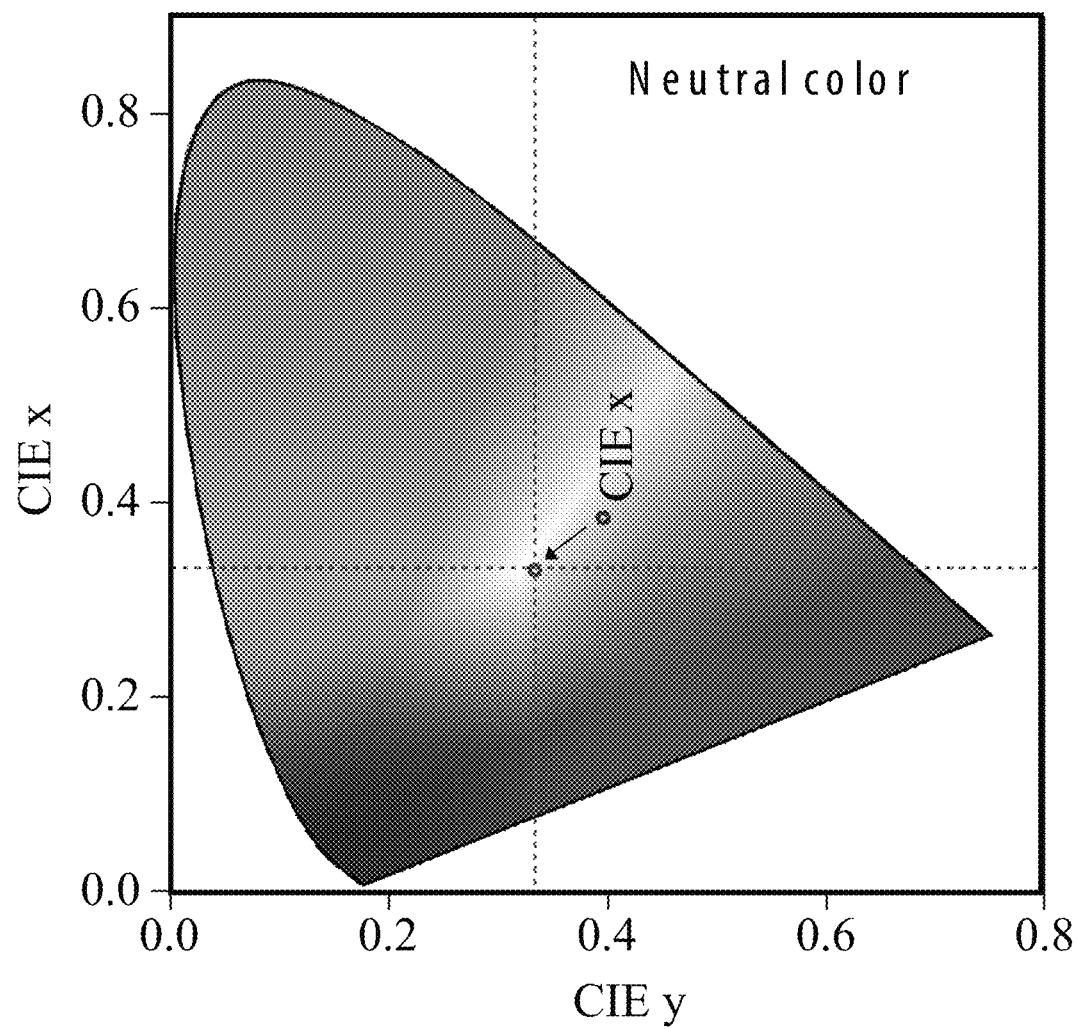
FIG. 7C illustrates a CIE coordinate system showing the color coordinate values for an original device (without a color-conversion layer) and the same device after including a color-tuning layer and a redirecting layer as illustrated in FIG. 7B, according to some embodiments of the present disclosure.
Figure 7D:
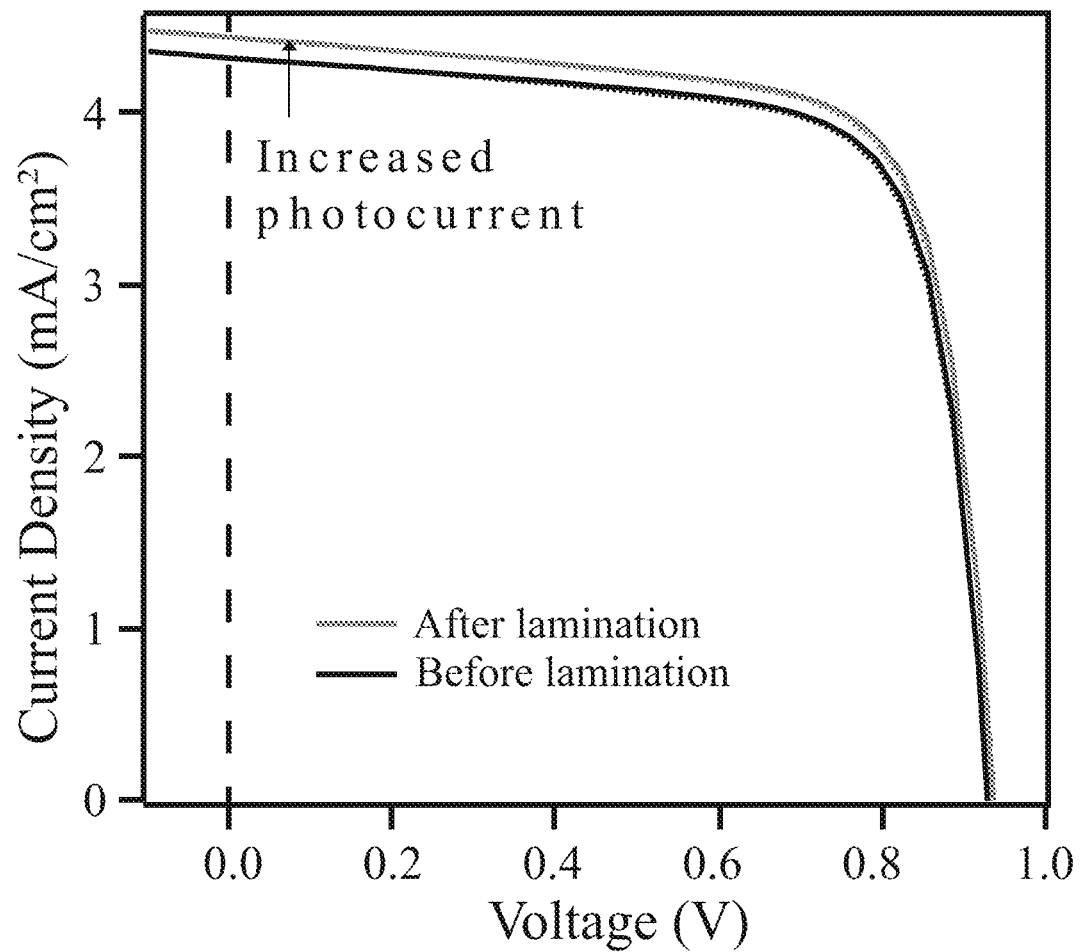
FIG. 7D illustrates representative current-voltage (JV) scans highlighting the increased photocurrent resulting from the device having the color-conversion layer (color-tuning layer and redirecting layer) versus without a color-conversion layer, as shown in FIG. 7B, according to some embodiments of the present disclosure.

A color-tuning layer may be deposited onto a separate piece of glass by simple solution processing methods (see FIG. 7B), thereby allowing facile fabrication without damaging the underlying PV device during processing. Alternatively, in some embodiments of the present disclosure, a color-tuning layer may be evaporated onto a separate piece of glass or directly onto a device, e.g., PV stack. As shown herein, accurate neutral color (CIE x=0.33, CIE y=0.33±0.01) has been achieved in a laminated semi-transparent device (see FIG. 7C). In addition, the resulting laminated neutral color semi-transparent PV device also showed enhanced photocurrent (see FIG. 7D). This demonstrates the ability of the concepts described herein to harness photons emitted by a color-tuning layer, instead of losing the photon energy as heat, which typically occurs in devices that do not efficiently absorb the incoming light.

Figure 8A:
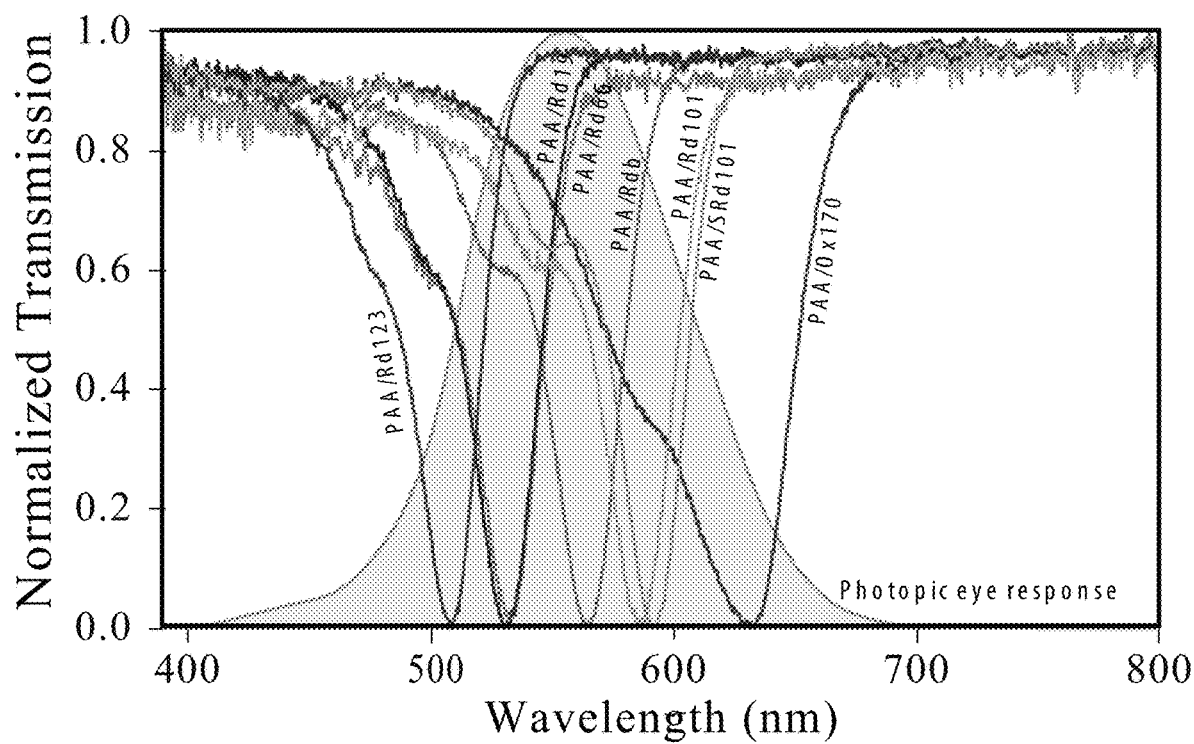
FIG. 8A illustrates normalized transmission spectra across the visible light spectrum of an exemplary color-tuning layer constructed of polyacrylic acid (PAA)/dye films across visible light spectrum, according to some embodiments of the present disclosure.
Figure 8B:
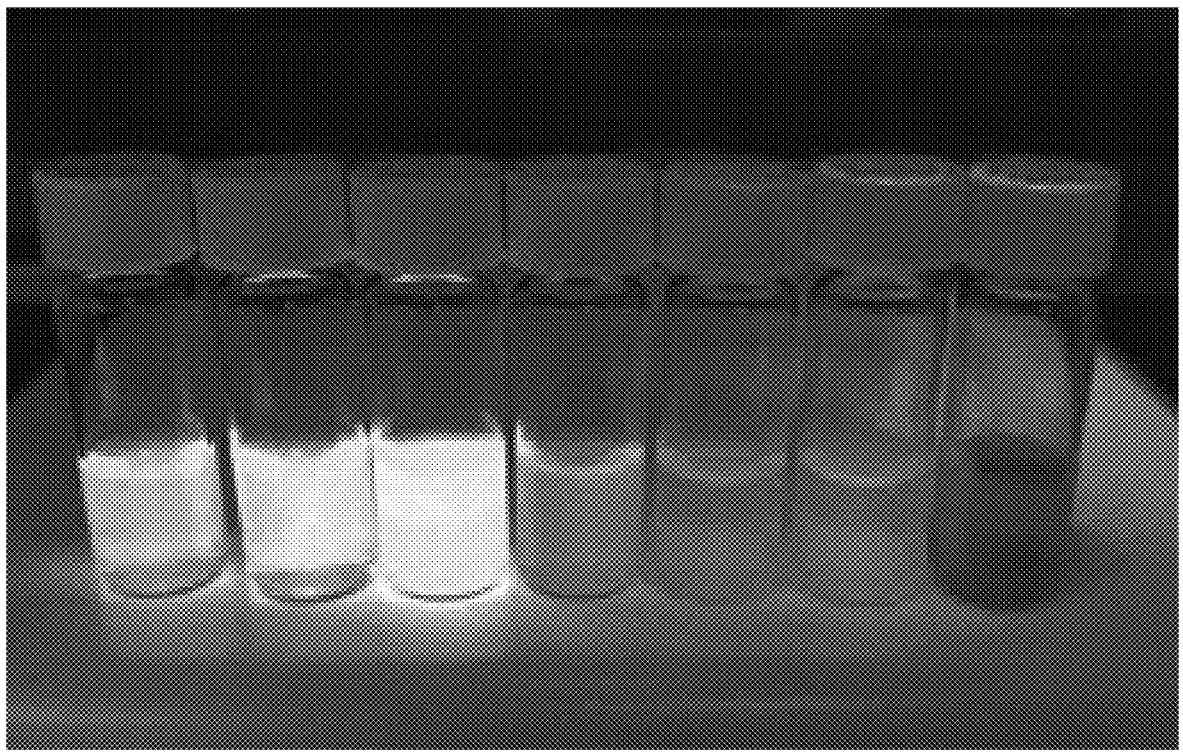
FIG. 8B illustrates a photograph of dye/methanol solutions from shortest to longest emission wavelengths under UV illumination to highlight the high photoluminescence quantum yield (PLQY) achievable by these materials, according to some embodiments of the present disclosure.

A re-emitting color-tuning layer may be fabricated from any material having a high photoluminescence quantum yield (PLQY) and the correct absorption and re-emission wavelengths for color-tuning and PV device absorption. Commercially available xanthene dyes were selected because their absorption and re-emission wavelengths across the visible region enabled finely tuning color-tuning layers to desirable absorption and emission wavelengths. Oxazine-170 (Ox170), rhodamine B (RdB), rhodamine 6G (Rd6G), rhodamine 19 (Rd19), rhodamine 101 (Rd101), rhodamine 123 (Rd123), and sulforhodamine 101 (SRd101) were positioned in poly-acrylic acid (PAA) to form solid-state thin-film layers with absorption peaks across the photopic eye response (see FIG. 8A). In addition, these dyes have high PLQY (see FIG. 8B) when positioned in solid-state PAA films, enabling enhanced light re-emission from the solid-state (dye embedded into solid PAA films) into the PV device. The concentration range of dye in the matrix may be any value. However, in some embodiments of the present disclosure, dye concentrations are provided to achieve high PLQY and may be in a concentration range between 0.001 mM and 100 mM.

Any other dye and/or photoluminescence material having suitable absorption and remission wavelengths may be used for a re-emitting color-tuning layer. Suitable absorption and remission wavelengths depend on the transmission and absorption spectra of the PV device. Typically, thin semi-conductor films in PV devices like thin perovskite films will absorb more strongly in the red wavelengths and transmit in the blue. To balance the color, the color-tuning layer should absorb in the blue wavelengths to flatten the transmission across the visible region and photopic eye response. The photopic eye response ranges between 400 and 700 nm, with the highest sensitivity at about 555 nm. The re-emission wavelength can be any wavelength, but in order to increase the power output or performance of the PV device it needs re-emit at wavelengths the PV material can absorb. Other matrix materials may also be used such as (methyl methacrylate (PMMA), poly(vinyl acetate) (PVAc), polyvinylcarbazol (PVK), and/or compounds such as tris(8-hydroxyquinolinato)aluminium. An inorganic matrix may also be used such as glass, silica ($SiO_2$), alumina ($Al_2O_3$), and/or zinc sulfide (ZnS). A matrix to hold dye molecules may also include nanoparticles such as Ag or Au nanoparticles to enhance fluorescence efficiency.

Figure 8C:
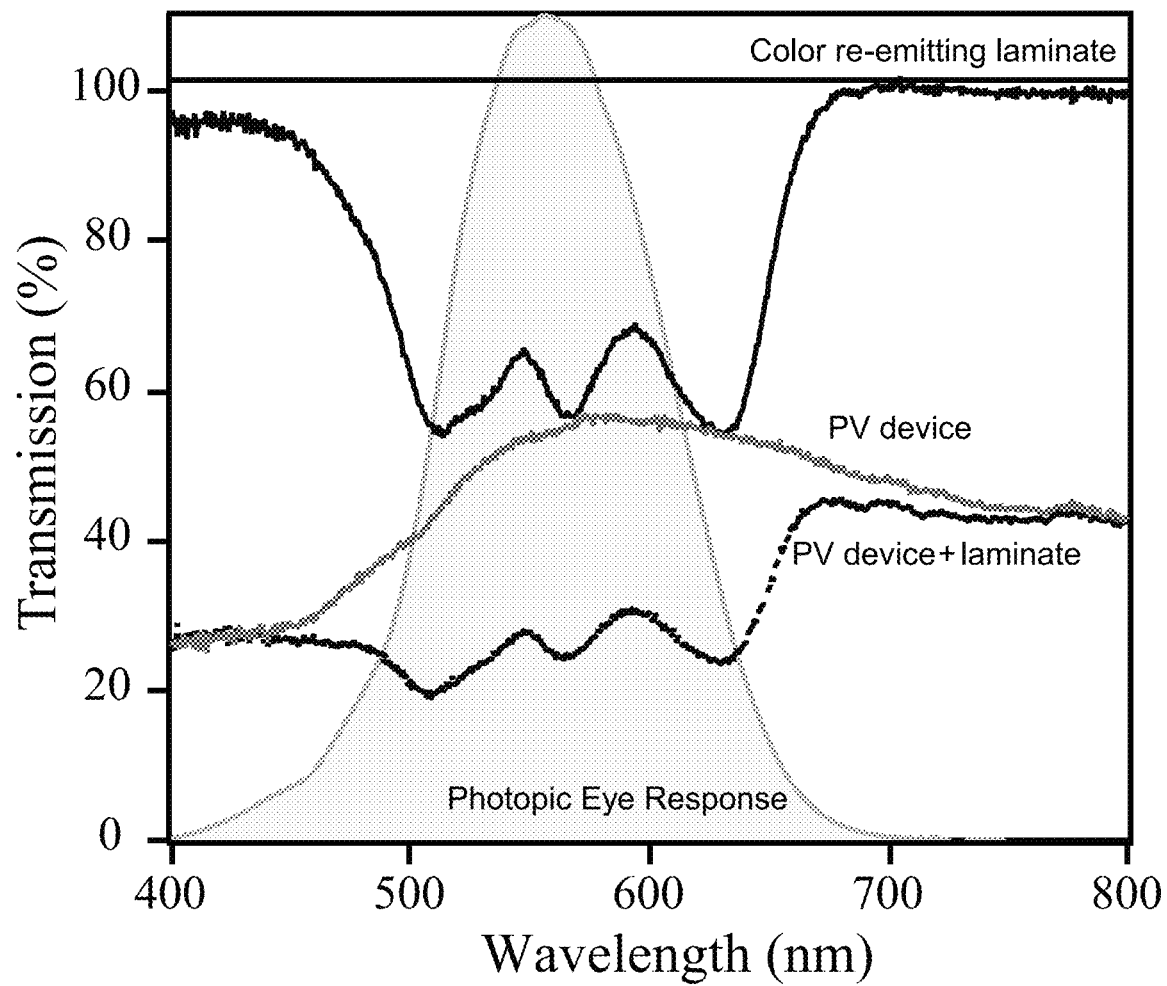
FIG. 8C illustrates transmission spectra of the combined multiple dye/PAA color-tuning laminate film (black trace), the semi-transparent PV device (gray trace), and the combined neutral color device (dashed trace), according to some embodiments of the present disclosure.
Figure 8D:
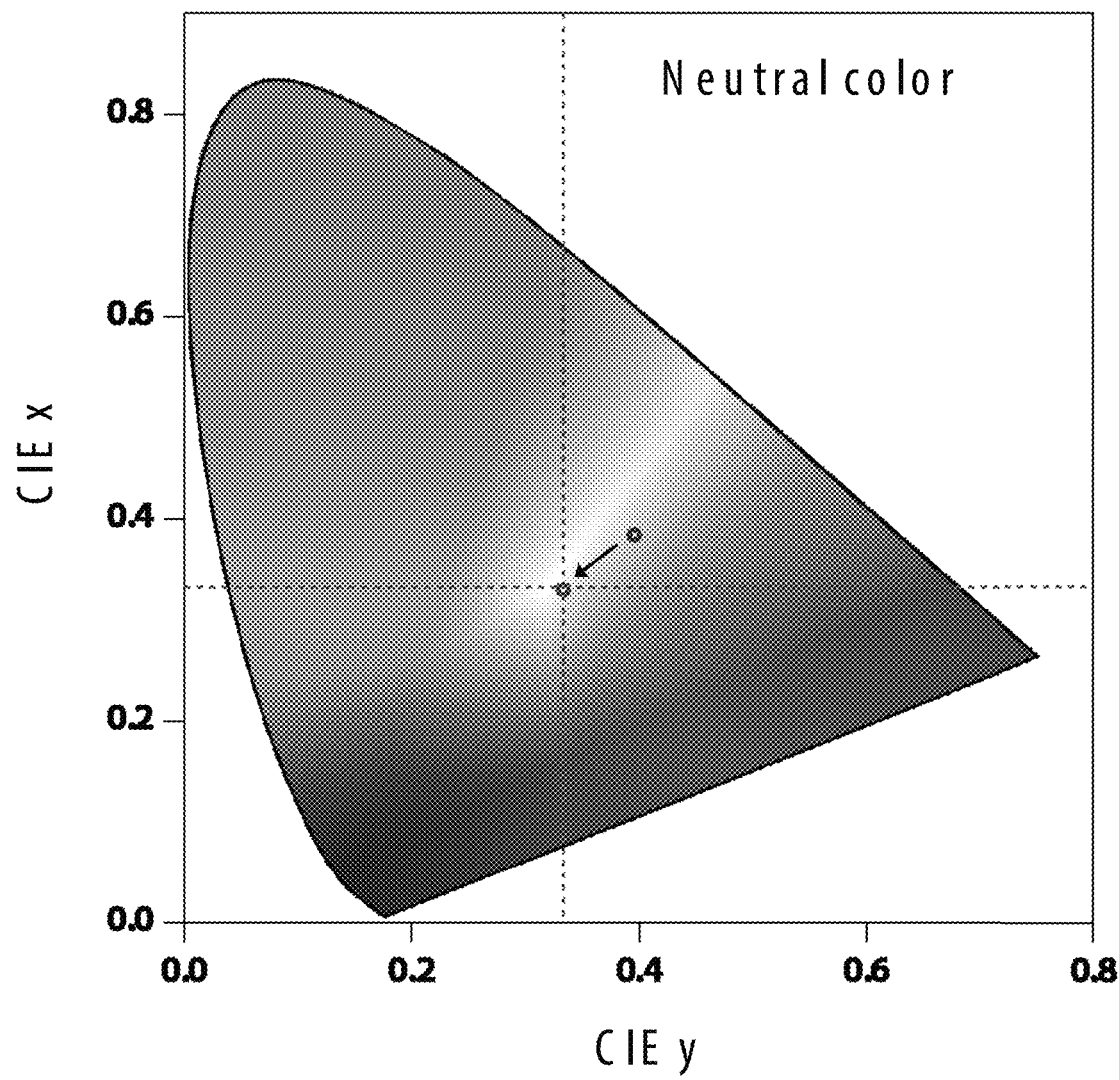
FIG. 8D illustrates the CIE coordinate system showing original device and post-laminate neutral color coordinates, according to some embodiments of the present disclosure.

A re-emitting color-tuning layer should force a relatively constant transmission spectra across the photopic eye response to achieve a neutral color in the laminated device. To achieve this, several dyes were combined into a single re-emitting color-tuning layer to achieve neutral color with semi-transparent perovskite PV devices used in these studies. Ox170, RdB, Rd19, and Rd123 were sequentially spun coat onto a glass substrate to form a laminate film with transmission peaks across the photopic eye response, which balances the transmission spectra of the combined laminated device (see FIG. 8C). In order to accurately assess the color, the CIE coordinates were calculated and the final device successfully achieved neutral color (see FIG. 8D).

Figure 9A:
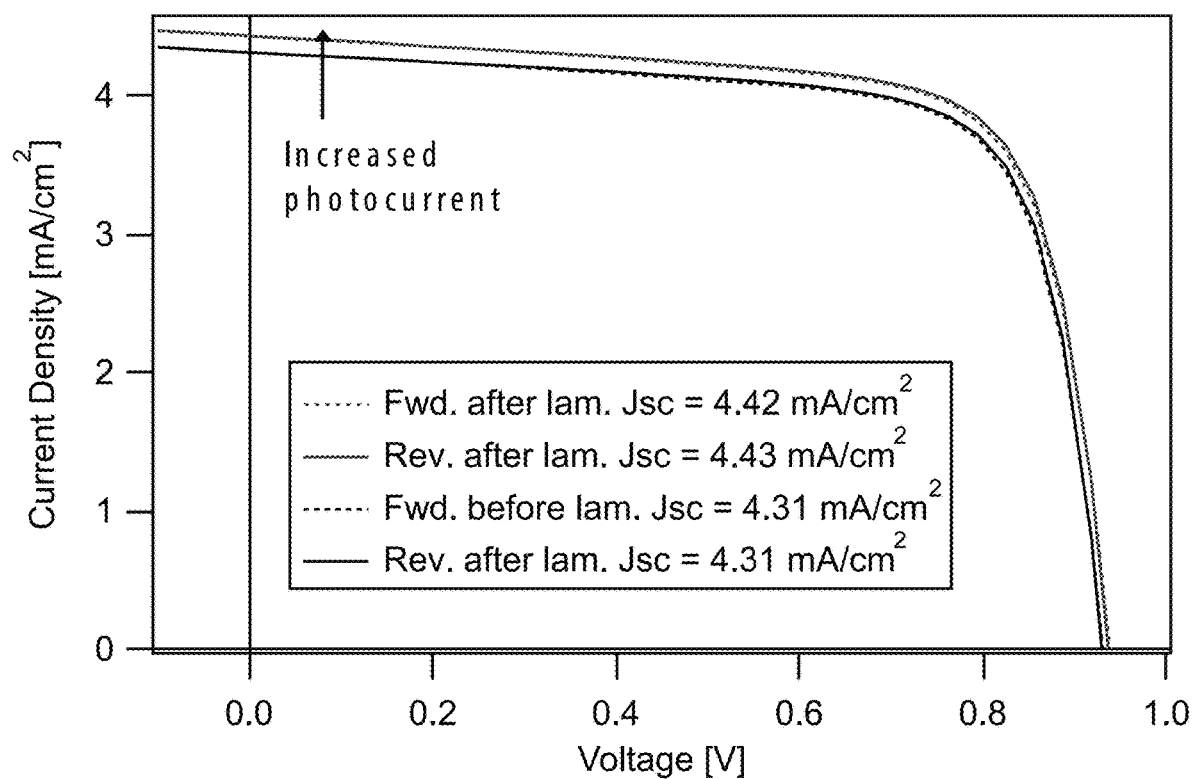
FIG. 9A illustrates representative forward and reverse current density-voltage (JV) scans highlighting the increased photocurrent after the re-emitted laminate was added to the device as a result of incorporating a color-balance layer, according to some embodiments of the present disclosure.
Figure 9B:
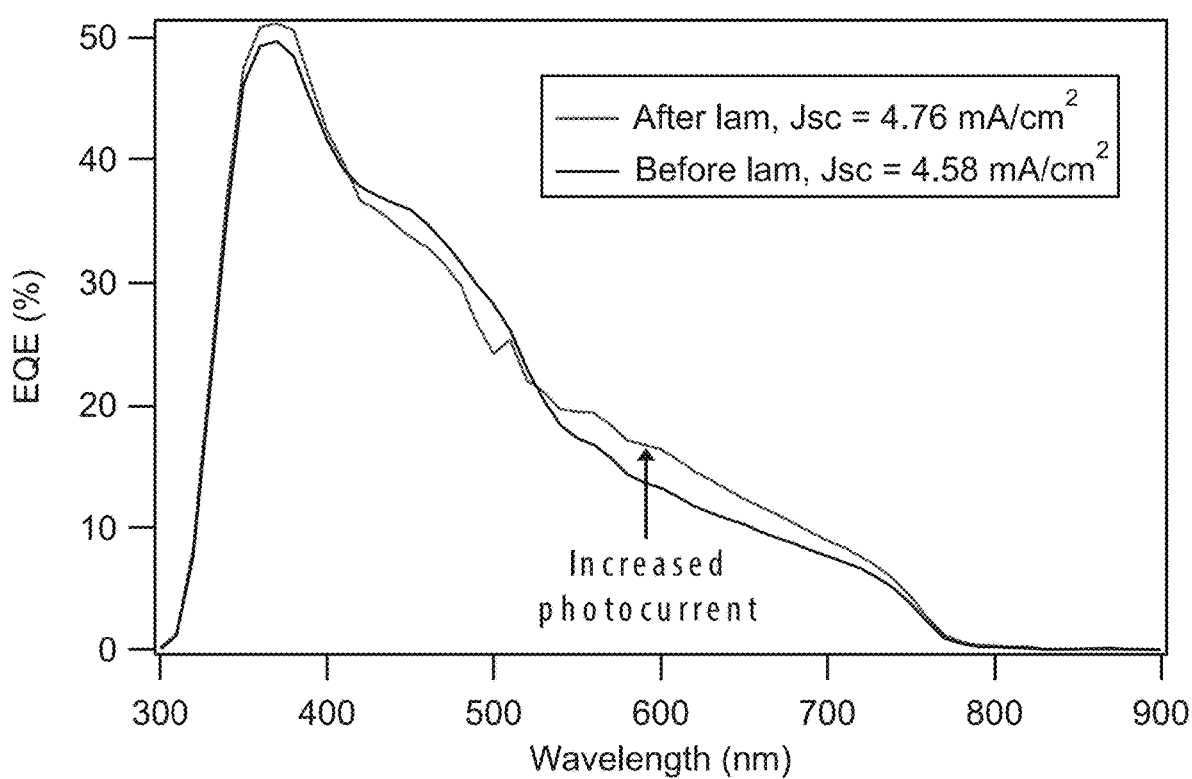
FIG. 9B illustrates external quantum efficiency (EQE) spectra of device before and after laminate highlighting increased photocurrent in the visible region, according to some embodiments of the present disclosure
Figure 9C:
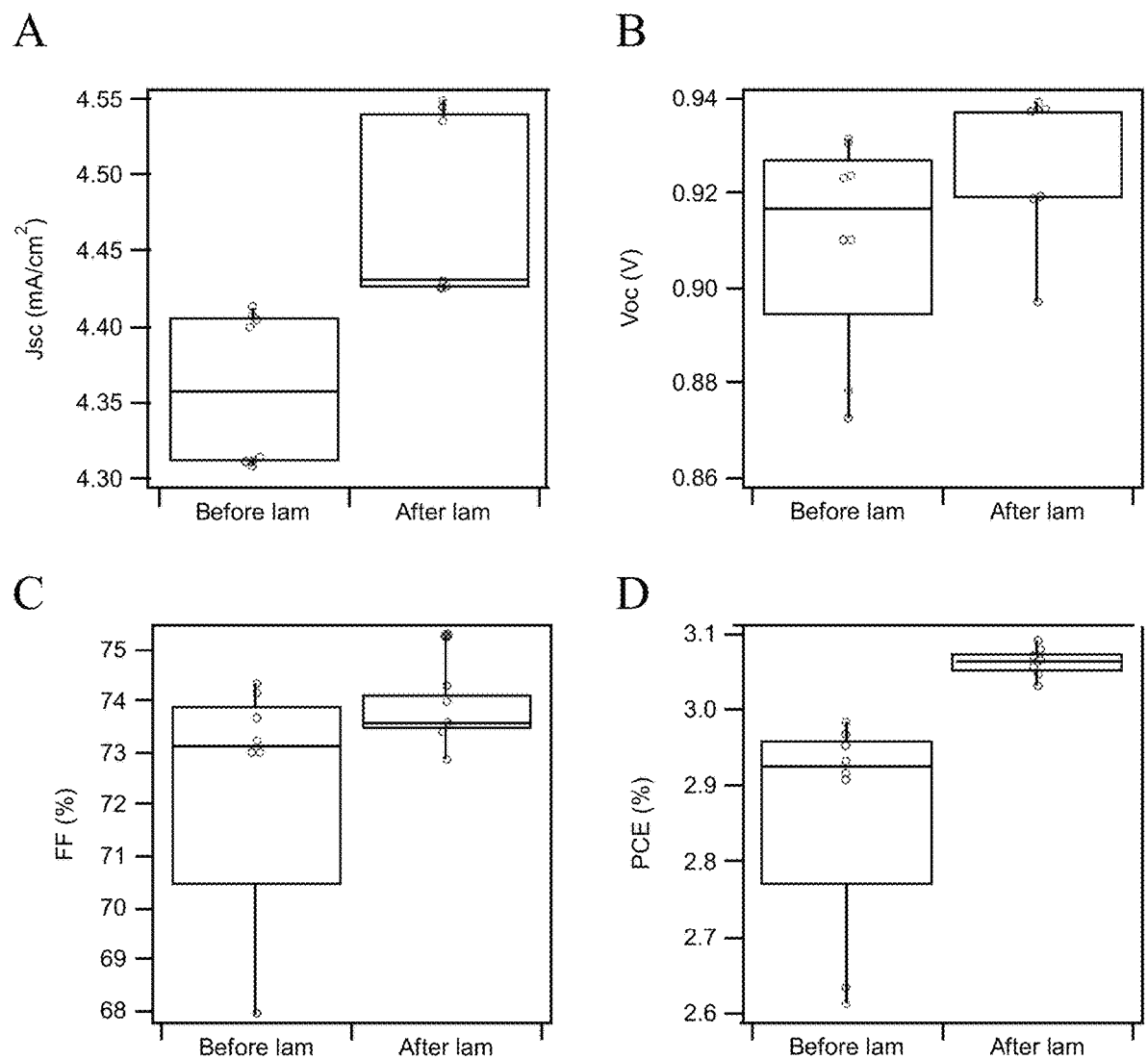
FIG. 9C illustrates: A) short-circuit current density ($J_{sc}$), B) open-circuit voltage ($V_{oc}$), C) fill factor (FF), and D) power-conversion efficiency (PCE) statistics before and after lamination from four devices, according to some embodiments of the present disclosure.

The re-emitting color-tuning layer tested increased the photocurrent of the semi-transparent PV device after lamination. Current density-voltage (JV) scans are a standard method for characterizing solar cell performance metrics including short-circuit current density ($J_{sc}$), which is due to the generation and collection of light-generated carriers or photocurrent. After lamination, the semi-transparent PV device had a 2.9% increase in $J_{sc}$ (see FIG. 9A). This increase in photocurrent was further confirmed using external quantum efficiency (EQE) measurements which showed a 3.9% increase in the integrated $J_{sc}$, and revealed the major increase was in the visible light region where the PAA/dye layer is re-emitting (see FIG. 9B). The increase in $J_{sc}$ was consistent across four devices, while $V_{oc}$ and FF improved only slightly, resulting in enhanced PCE after lamination (see FIG. 9C).

Alternatively, the color of a device may be tuned and the PV performance simultaneously boosted using one or more layers constructed of materials that preferentially reflect certain wavelengths including one-dimensional photonic crystals or Bragg reflectors, instead of photoluminescence materials as previously discussed. As described above, such embodiments are referred to herein as intermediate layers configures as reflecting layers. Bragg reflectors, or one-dimensional photonic crystals, are optical nanostructures comprised of regularly repeating thin-films of high and low refractive index. A Bragg reflector may transmit and/or reflect certain wavelengths of light by destructive interference, depending on the wavelength (k), refractive indexes ($n_L$ low, $n_H$ high), and thickness ($t_L$ low, $t_H$ high) of each layer. The thicknesses are generally designed based on $t_H=\lambda/4n_H$ and $t_L=\lambda/4n_L$. Examples of low refractive index ($n_L$) materials include molybdenum oxide ($MoO_3$) and magnesium fluoride ($MgF_2$) and an example of a high refractive index ($n_H$) material is lithium fluoride (LiF). To reflect in the red wavelengths, a Bragg reflector was designed using alternating $MoO_3$ and $MgF_2$ layers with thicknesses of about 75 and about 140 nm, respectively (see FIG. 10B (top)). Any material may be used so long as it has the appropriate refractive indexes that can satisfy the target reflective wavelength (k) for a desired PV absorption governed by the equations above.

Figure 10A:
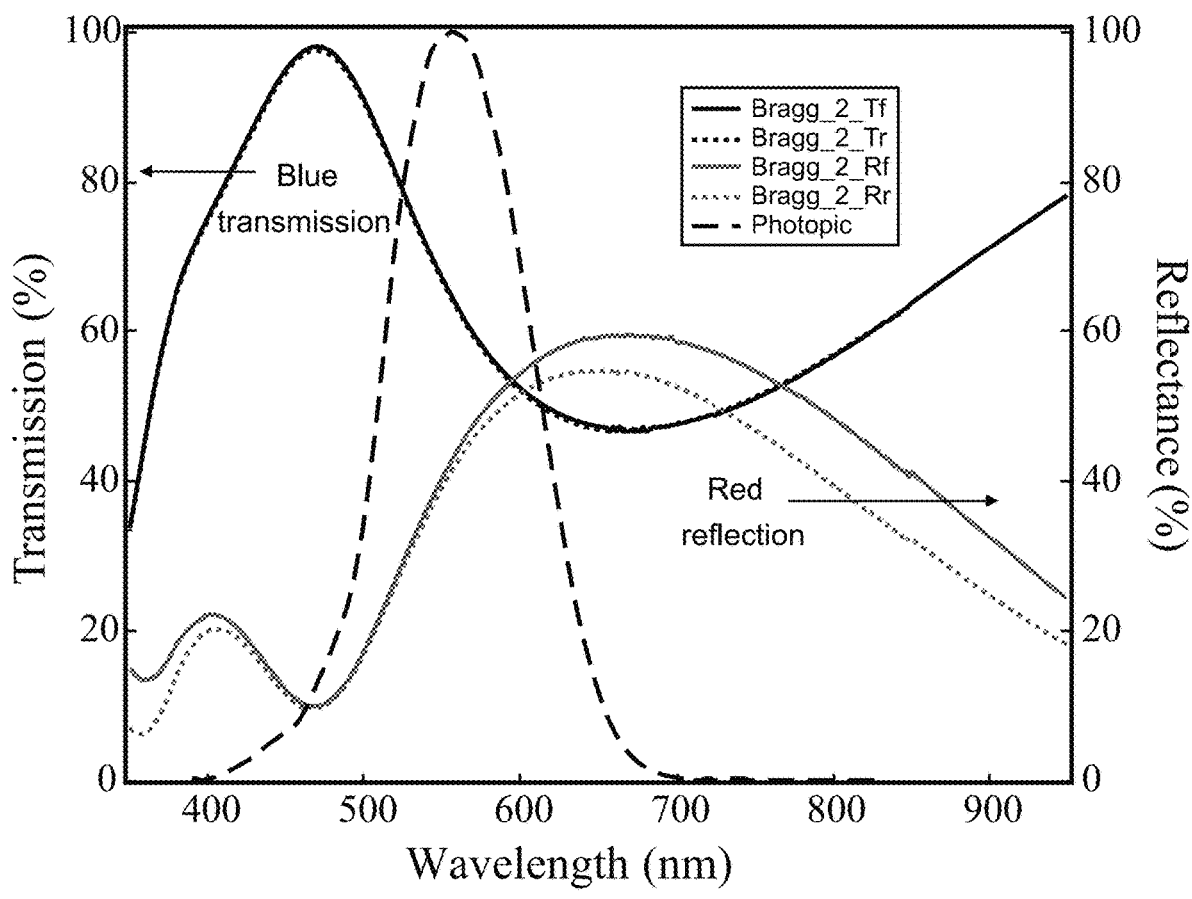
FIGS. 10A-10D illustrate various features of a PV device utilizing a Bragg reflector, according to some embodiments of the present disclosure.
Figure 10B:
Figure 10B:
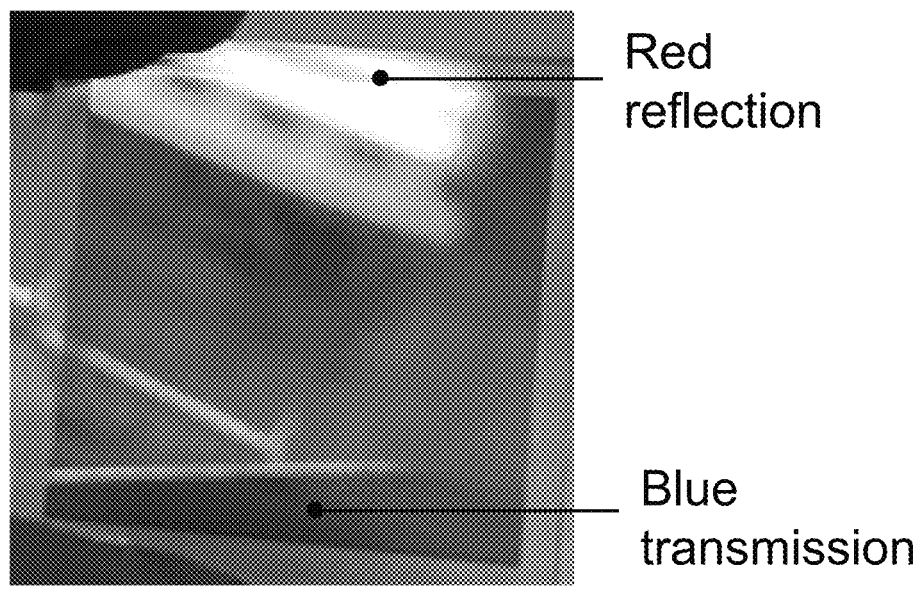
Figure 10C:
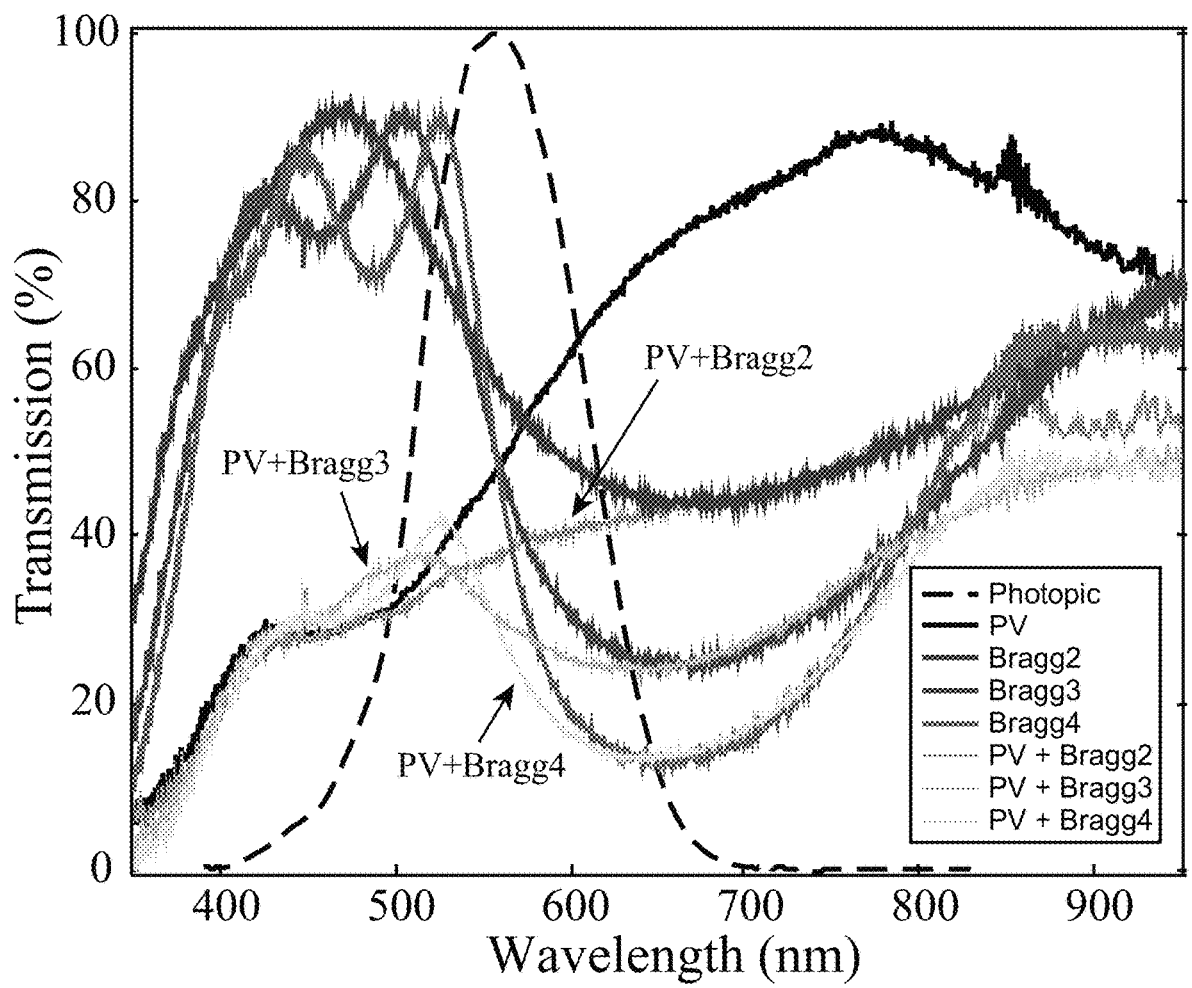
Figure 10D:
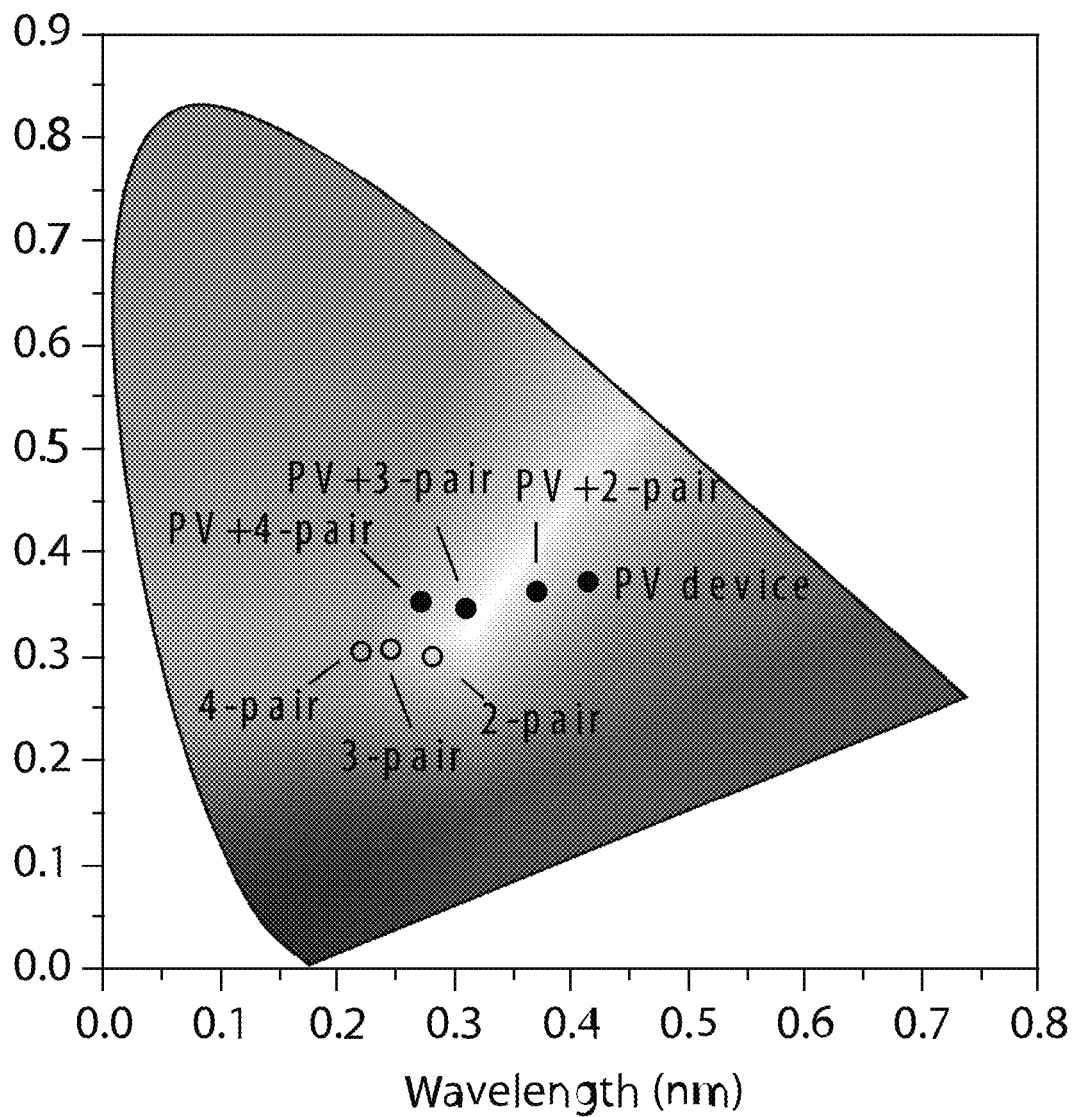
Figure 11A:
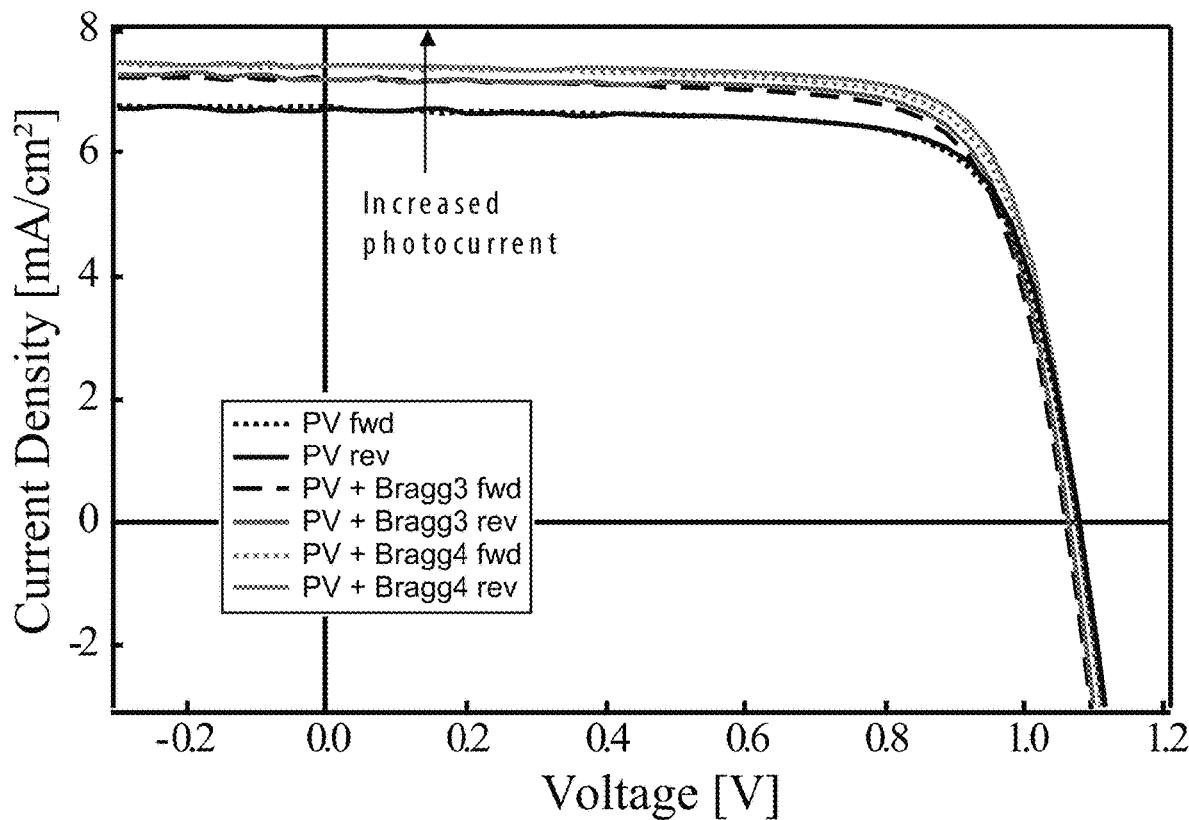
FIGS. 11A-11C illustrate PV performance metrics obtained for a PV device utilizing a Bragg reflector, according to some embodiments of the present disclosure.
Figure 11B:
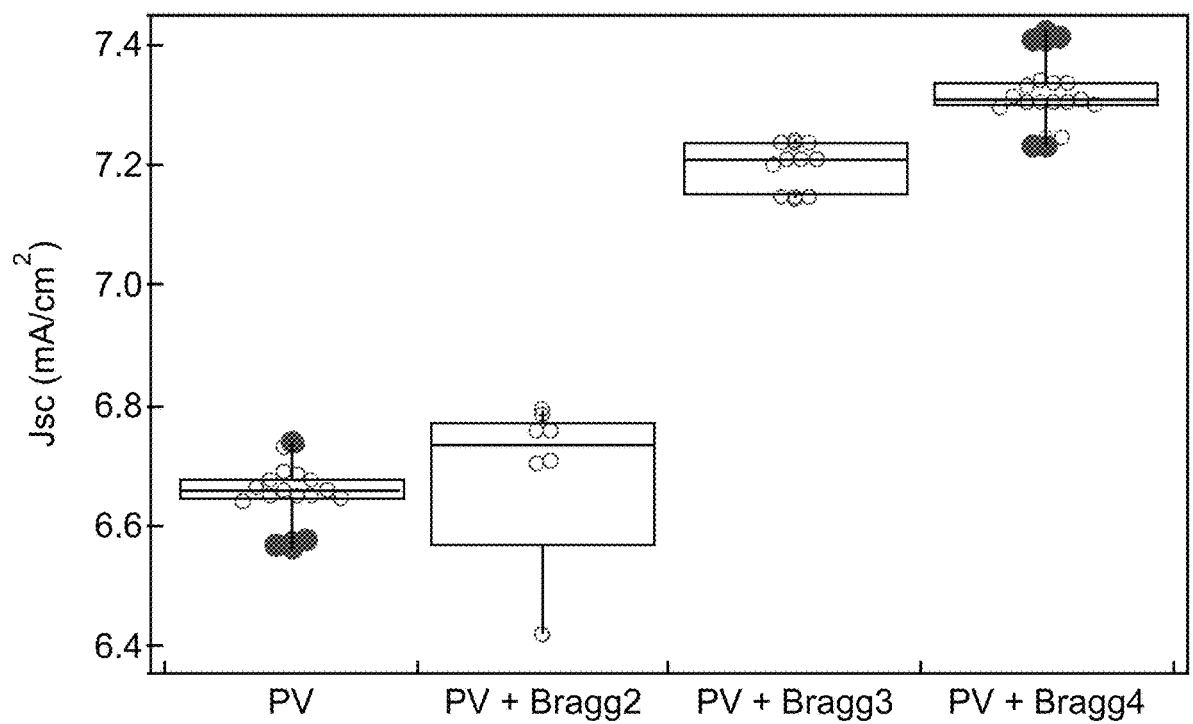
Figure 11C:
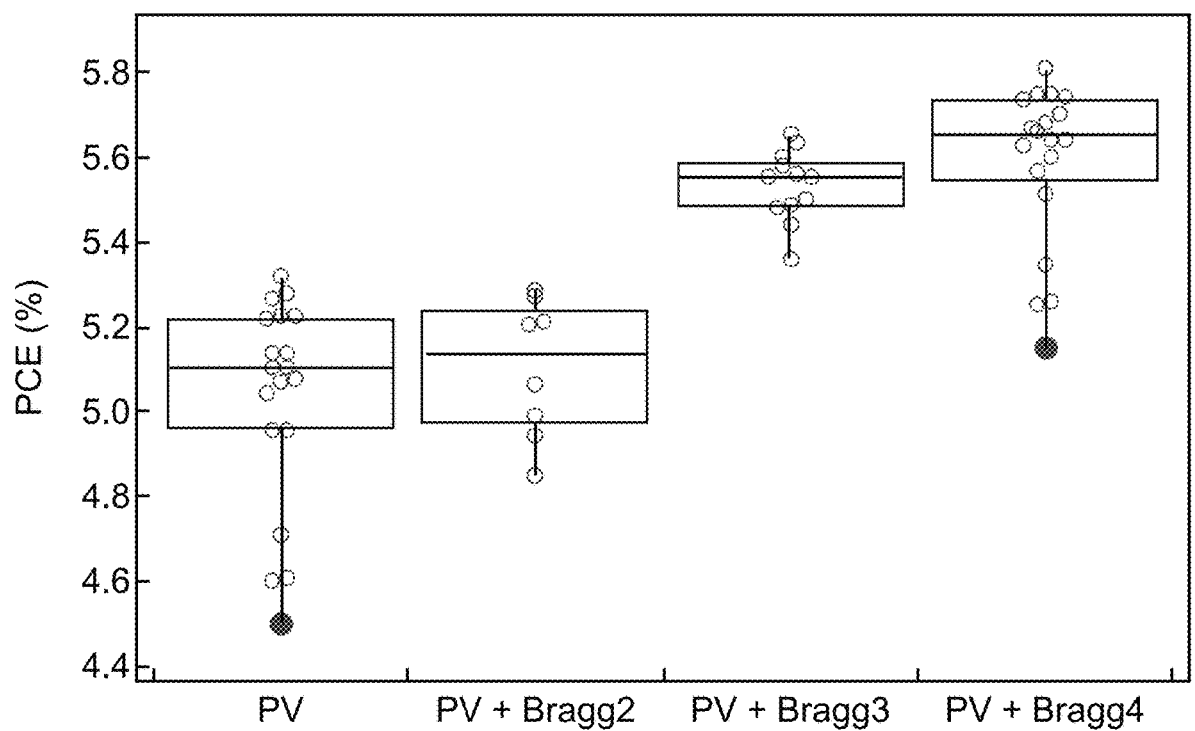

Bragg reflectors constructed of alternating layers of $MoO_3$ and $MgF_2$ were sequentially evaporated onto a glass substrate (see FIG. 10B (bottom)) to form a laminate film with transmission peaks in the blue and reflection peaks in the red (see FIG. 10A). Multiple pairs of these alternative layers can be sequentially evaporated to increase the transmission in the blue and reflection in the red (see FIG. 10C). The CIE coordinates of the multiple pairs of alternating $MoO_3$ and $MgF_2$ layers and the combination with the PV layer show tunable color and achieved neutral color (see FIG. 10D). The Bragg reflector color-tuning layers increased $J_{sc}$ and PCE (see FIGS. 11B and 11C). In addition to boosting performance of the PV layer, Bragg reflectors can also be designed to reflect infrared wavelengths to improve thermal performance of a full PV window. FIG. 11A illustrates JV curves for three different device stacks; a PV stack without a Bragg reflector and device stacks either three repeat layers in a Bragg reflector or four repeat layers in a Bragg reflector. In some embodiments of the present disclosure, a reflecting layer may be constructed using a thin, transparent metal foil. In some embodiments of the present disclosure, a reflecting layer may be constructed using alternating layers of a thin, transparent metal foil and a transparent dielectric layer.

Figure 12A:
FIG. 12A illustrates an IR-reflective intermediate layer, according to some embodiments of the present disclosure.
Figure 12B:
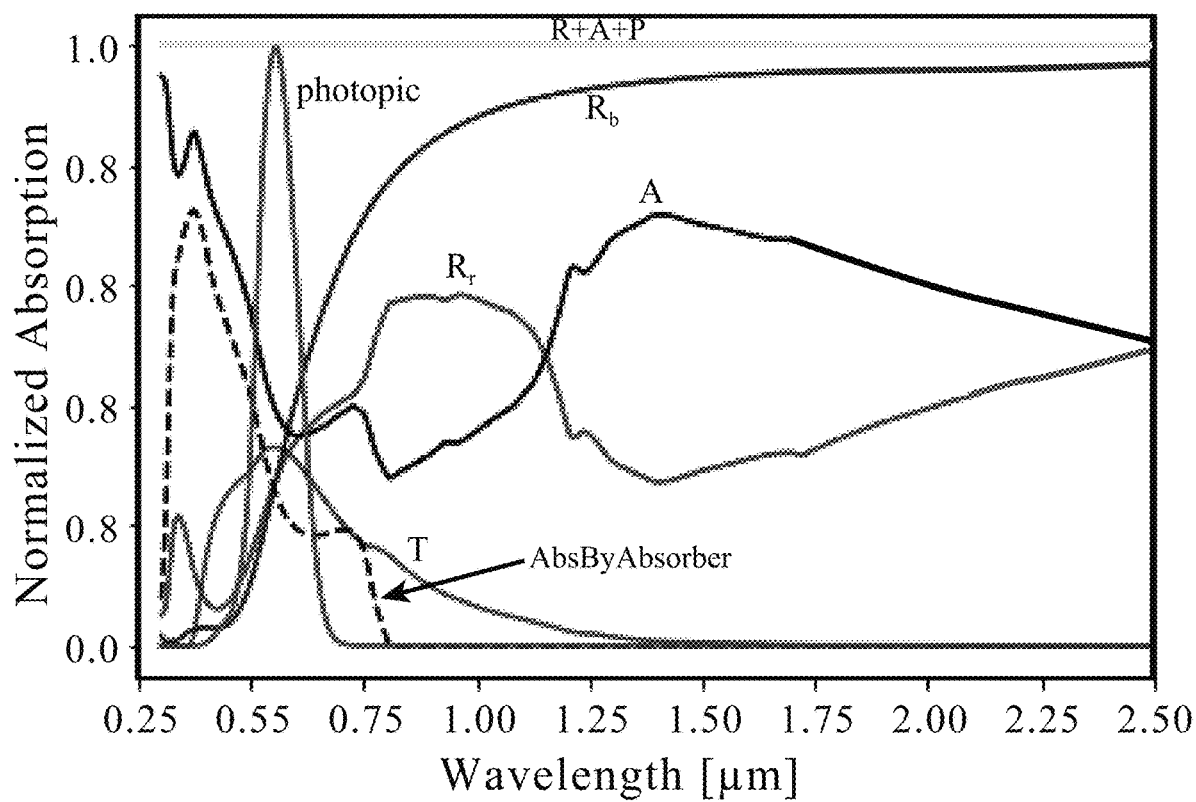
FIG. 12B illustrates a reflection spectrum attained from the device illustrated in FIG. 12A, according to some embodiments of the present disclosure.

FIG. 12A illustrates an IR-reflective intermediate layer constructed of molybdenum oxide and silver layers of different subwavelength thicknesses, according to some embodiments of the present disclosure. The stack of layers produces a reflection spectrum that reflects red light into the PV layer and longer infrared wavelengths out of the system, as illustrated in FIG. 12B.

This work demonstrates the ability to balance the color of a thin semi-transparent PV device while simultaneously improving the photocurrent and performance of a semi-transparent PV device by utilizing a re-emitting layer with photoluminescent materials or a reflective layer such as a Bragg reflector. This method can be employed across a range of semi-transparent PV device materials and color-tuning materials to achieve neutral color and high-performing semi-transparent PV devices for various applications.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A photovoltaic (PV) device comprising:
   a color-tuning layer comprising a dye positioned within a matrix; and
   a PV layer comprising a perovskite, wherein:
   the color-tuning layer is capable of absorbing light comprising a first wavelength and emitting light comprising a second wavelength,
   the first wavelength is between 400 nm and 700 nm,
   the second wavelength is greater than the first wavelength,
   the PV layer has a disordered state and an ordered state,
   the PV layer is not substantially photoactive when in the disordered state,
   the PV layer is configured to absorb a portion of the second wavelength when in the ordered state,
   the device is at least partially transparent to light in the visible spectrum when the PV layer is in the disordered, and
   the device is at least partially opaque to light in the visible spectrum when the PV layer is in the ordered state.

2. The PV device of claim 1, wherein the second wavelength is between about 400 nm and 700 nm.

3. The PV device of claim 1, wherein the matrix comprises at least one of a solid, a liquid, or a gas.

4. The PV device of claim 1, wherein the dye comprises xanthene dye.

5. The PV device of claim 1, wherein the dye comprises at least one of an oxazine, a rhodamine, or tris(8-hydroxyquinolinato)aluminum.

6. The PV device of claim 3, wherein the matrix is a solid.

7. The PV device of claim 6, wherein the solid matrix comprises at least one of a polymer, a glass, a metal oxide, lithium fluoride, magnesium fluoride, or zinc sulfide.

8. The PV device of claim 7, wherein the polymer comprises at least one of poly-acrylic acid, poly(methyl methacrylate), poly(vinyl acetate), polyvinylcarbozal, or polystyrene.

9. The PV device of claim 7, wherein the metal oxide comprises at least one of silica or alumina.

10. The PV device of claim 6, wherein the matrix comprises a plurality of nanoparticles.

11. The PV device of claim 1, wherein the color-tuning layer has a thickness between 5 nm and 300 nm.

12. The PV device of claim 1, wherein:
    the PV layer is part of a PV stack, and
    the PV stack further comprises:
       a hole transfer layer (HTL);
       an electron transfer layer (ETL);
       a first charge collecting layer; and
       a second charge collecting layer; wherein:
    the PV layer is positioned between the HTL and the ETL,
    the HTL is positioned between the first charge collecting layer and the PV layer, and
    the ETL is positioned between the second charge collecting layer and the PV layer.

13. The PV device of claim 12, wherein:
    an intermediate layer comprises at least one layer of the PV stack or a separate layer, and
    the intermediate layer is positioned between the PV layer and the color-tuning layer.

14. The device of claim 1, wherein the PV layer generates a voltage when in the ordered state.

\* \* \* \* \*